(12) United States Patent
Lin et al.

(10) Patent No.: US 12,176,415 B2
(45) Date of Patent: Dec. 24, 2024

(54) DEVICE WITH A DUMMY FIN CONTACTING A GATE ISOLATION REGION

(71) Applicant: Taiwan Semiconductor Manufacturing Co., Ltd., Hsinchu (TW)

(72) Inventors: Shih-Yao Lin, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/814,756

(22) Filed: Jul. 25, 2022

(65) Prior Publication Data
US 2022/0359721 A1    Nov. 10, 2022

Related U.S. Application Data

(62) Division of application No. 16/939,943, filed on Jul. 27, 2020, now Pat. No. 11,837,649.

(Continued)

(51) Int. Cl.
*H01L 29/66*     (2006.01)
*H01L 21/8234*   (2006.01)
(Continued)

(52) U.S. Cl.
CPC ............... *H01L 29/66545* (2013.01); *H01L 21/823462* (2013.01); *H01L 21/823481* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/0649;
(Continued)

(56) References Cited

U.S. PATENT DOCUMENTS

| 9,659,932 B2 | 5/2017 | Huang |
| 9,704,974 B2 | 7/2017 | Chang et al. |

(Continued)

FOREIGN PATENT DOCUMENTS

| CN | 103022103 A | 4/2013 |
| CN | 104681557 A | 6/2015 |

(Continued)

*Primary Examiner* — Younes Boulghassoul
(74) *Attorney, Agent, or Firm* — Slater Matsil, LLP

(57) ABSTRACT

A method includes forming an active channel region, forming a dummy channel region, forming a first gate dielectric layer over the active channel region, forming a second gate dielectric layer over the dummy channel region, removing the second gate dielectric layer from the dummy channel region, forming a gate isolation region over and contacting the dummy channel region, and forming a first gate stack and a second gate stack. The first gate stack is on the active channel region. The gate isolation region separates the first gate stack from the second gate stack.

20 Claims, 57 Drawing Sheets

Related U.S. Application Data

(60) Provisional application No. 63/013,105, filed on Apr. 21, 2020.

(51) Int. Cl.
*H01L 29/51* (2006.01)
*H01L 29/78* (2006.01)

(52) U.S. Cl.
CPC ........ *H01L 29/517* (2013.01); *H01L 29/6656* (2013.01); *H01L 29/6681* (2013.01); *H01L 29/66818* (2013.01); *H01L 29/785* (2013.01)

(58) Field of Classification Search
CPC ............. H01L 29/0653; H01L 29/6681; H01L 21/823481; H01L 21/823878; H01L 21/76224; H01L 21/76229; H01L 21/76232; H01L 29/42376; H01L 29/42384; H01L 29/786; H01L 21/28114; H01L 21/823437; H01L 21/823828; H01L 21/823456; H01L 21/82385; H01L 29/66545

See application file for complete search history.

(56) References Cited

U.S. PATENT DOCUMENTS

| | | | |
|---|---|---|---|
| 9,780,200 | B2 | 10/2017 | Zhu |
| 10,867,865 | B2 | 12/2020 | Chang et al. |
| 10,916,477 | B2 | 2/2021 | Hung et al. |
| 11,621,323 | B2 | 4/2023 | Ching et al. |
| 2011/0159678 | A1* | 6/2011 | Hsu .................. H01L 21/82345 438/587 |
| 2013/0075818 | A1 | 3/2013 | Lee et al. |
| 2015/0279995 | A1 | 10/2015 | Maeda et al. |
| 2017/0125411 | A1 | 5/2017 | Yu et al. |
| 2019/0006486 | A1* | 1/2019 | Ching ............. H01L 21/823878 |
| 2019/0067113 | A1 | 2/2019 | Chang et al. |
| 2019/0067417 | A1* | 2/2019 | Ching ............. H01L 21/823878 |
| 2019/0067444 | A1* | 2/2019 | Ching ............... H01L 21/02532 |
| 2019/0067446 | A1* | 2/2019 | Ching ................. H01L 29/6656 |
| 2019/0103304 | A1* | 4/2019 | Lin .................... H01L 29/66545 |
| 2019/0165127 | A1* | 5/2019 | Ching ............... H01L 21/76229 |
| 2019/0189804 | A1 | 6/2019 | You et al. |
| 2020/0020782 | A1* | 1/2020 | Ching ............... H01L 21/76224 |
| 2020/0058649 | A1* | 2/2020 | Ching ................. H01L 29/7848 |
| 2020/0066718 | A1* | 2/2020 | Li ....................... H01L 29/6681 |
| 2020/0091311 | A1* | 3/2020 | Hsu ................. H01L 21/823431 |
| 2020/0098750 | A1 | 3/2020 | Lin et al. |
| 2020/0105613 | A1* | 4/2020 | Hung ............... H01L 29/6659 |
| 2020/0105616 | A1* | 4/2020 | Liaw ............... H01L 21/823814 |
| 2020/0328207 | A1 | 10/2020 | Hong et al. |
| 2021/0126109 | A1* | 4/2021 | Lin ....................... H01L 27/088 |

FOREIGN PATENT DOCUMENTS

| | | |
|---|---|---|
| CN | 109427774 A | 3/2019 |
| KR | 20160093524 A | 8/2016 |
| KR | 20160115904 A | 10/2016 |
| KR | 20160123955 A | 10/2016 |
| KR | 20200037056 A | 4/2020 |

* cited by examiner

DEVICE WITH A DUMMY FIN CONTACTING A GATE ISOLATION REGION

PRIORITY CLAIM AND CROSS-REFERENCE

This application is a divisional of U.S. patent application Ser. No. 16/939,943, entitled "Selective Removal of Gate Dielectric from Dummy Fin," and filed Jul. 27, 2020, which claims the benefit of the Provisional U.S. Patent Application No. 63/013,105, entitled "Selective Deposition of gate Dielectric for Gate Formation Benefit," and filed on Apr. 21, 2020, which applications are hereby incorporated herein by reference.

BACKGROUND

Metal-Oxide-Semiconductor (MOS) devices are basic building elements in integrated circuits. A MOS device may have a gate electrode formed of polysilicon doped with p-type or n-type impurities, which are doped using doping processes such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves forming dummy gate dielectrics and dummy gate electrodes, removing the dummy gate dielectrics and the dummy gate electrodes to form trenches, depositing high-k dielectric layers and metal layers into the trenches, and performing a Chemical Mechanical Polish (CMP) process to remove excess portions of the high-k dielectric layer and the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
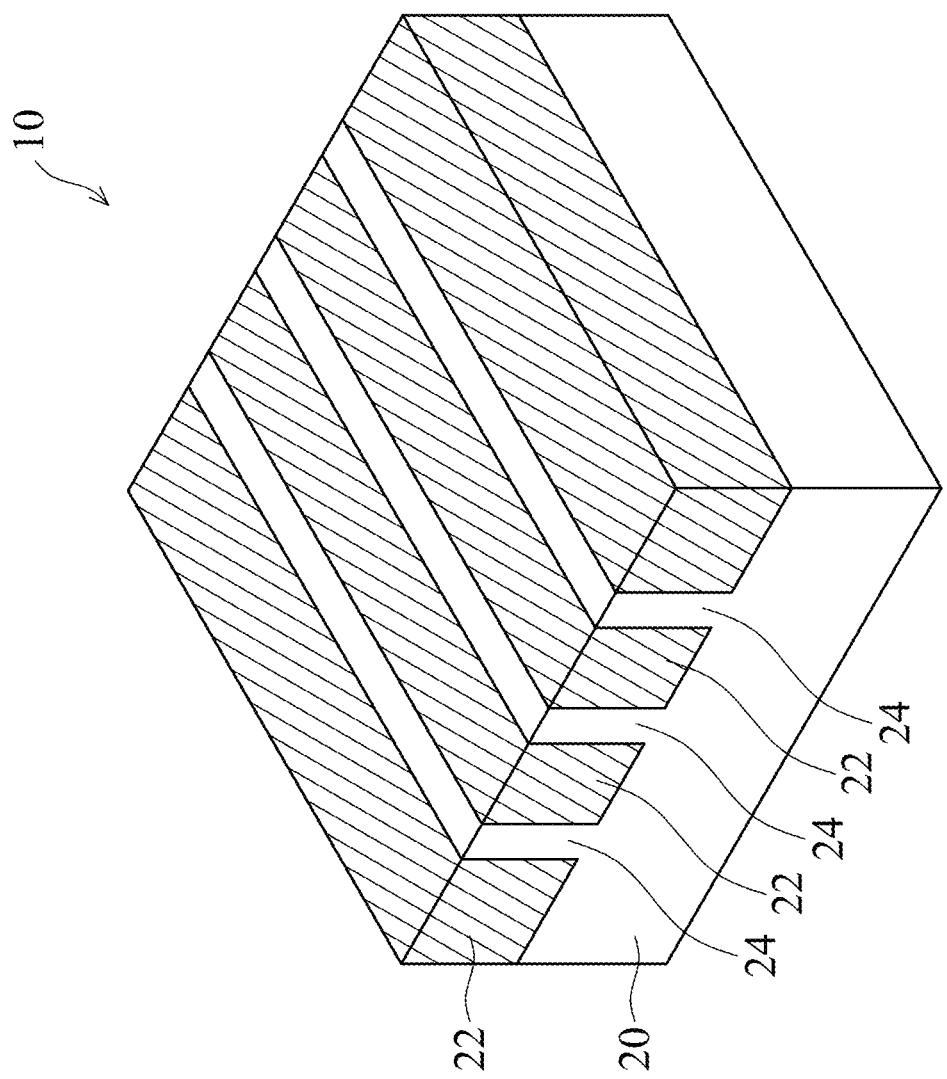
FIGS. 1-4, 5A, 5B, 6, 7A-1, 7A-2, 7B, 8A, 8B, 9A-1, 9A-2, and 9B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Pre-removal of dummy gate dielectrics from dielectric dummy fins and then forming gate isolation regions, and the formation of the corresponding Fin Field-Effect Transistors (FinFETs) are provided in accordance with some embodiments. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 63:
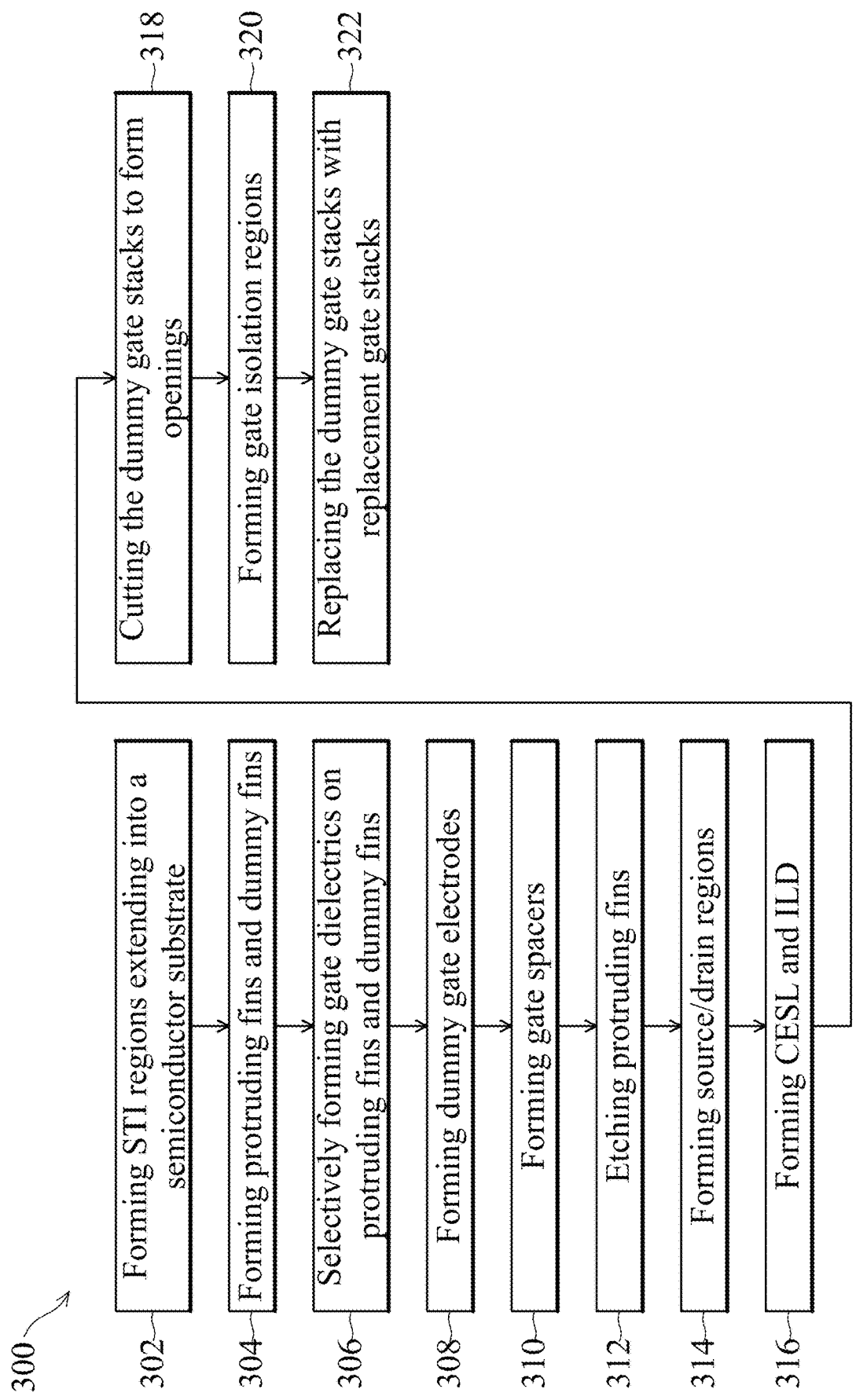
FIG. 63 illustrates a process flow for forming transistors with the selective removal of dummy gate dielectrics before forming gate isolation regions in accordance with some embodiments.

FIGS. 1-4, 5A, 5B, 6, 7A-1, 7A-2, 7B, 8A, 8B, 9A-1, 9A-2, and 9B illustrate the perspective views and cross-sectional views of intermediate stages in the formation of FinFETs, gate isolation regions and dielectric dummy fins in accordance with some embodiments of the present disclosure. The corresponding processes are also reflected schematically in the process flow 300 as shown in FIG. 63.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. The respective process is illustrated as process 302 in the process flow 300 as shown in FIG. 63. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, or a III-V compound semiconductor such as InP, GaAs, AlAs, InAs, InAlAs, InGaAs, or the like.

STI regions 22 may include a liner oxide (not shown separately), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
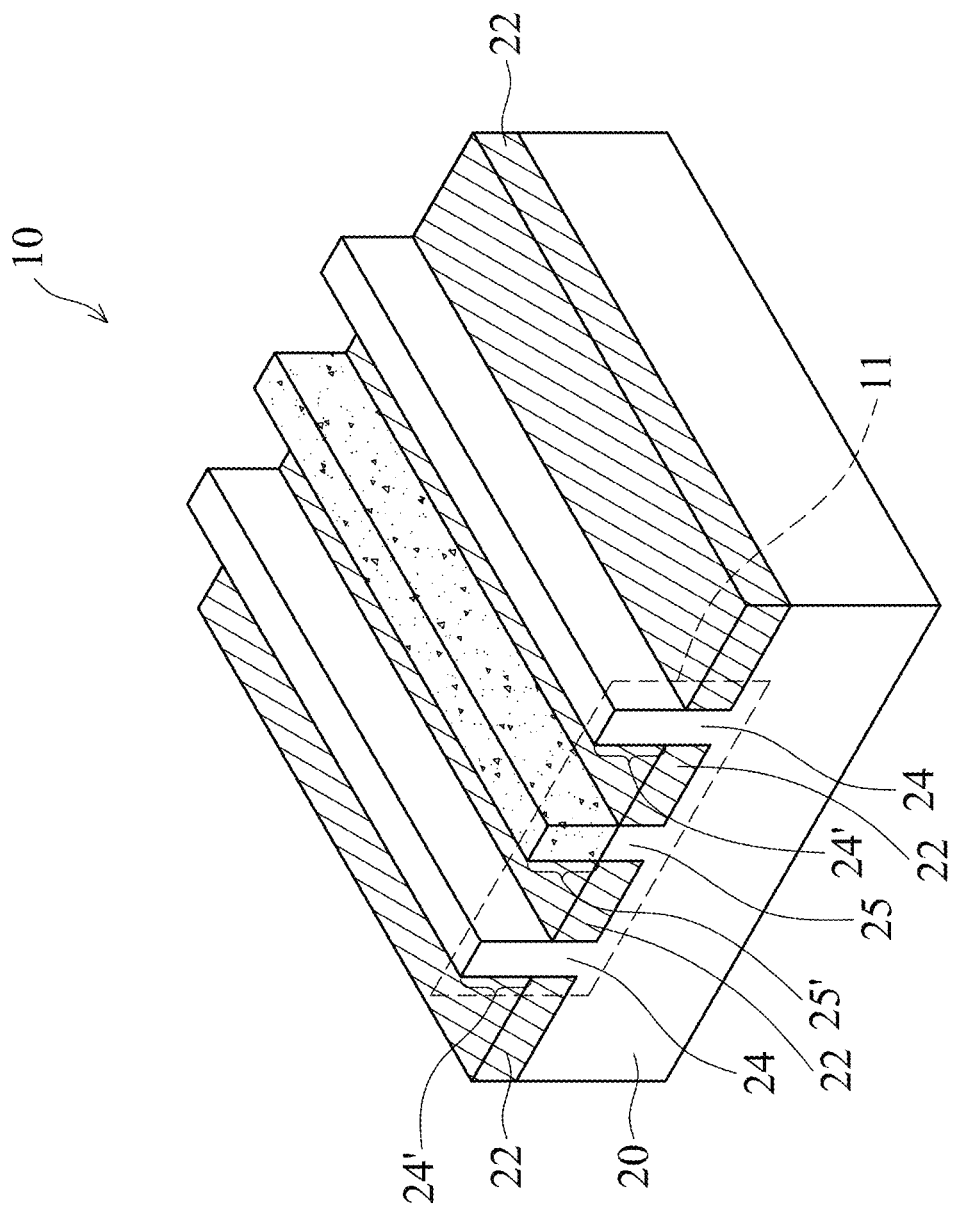

FIG. 2 illustrates the formation of dielectric dummy strip 25 and the recessing of STI regions 22. The top portions of semiconductor strips 24 and dielectric dummy strip 25 protrude higher than the top surfaces of STI regions 22 to form protruding (semiconductor) fins 24' and (dielectric) dummy fin 25', respectively. The respective process is illustrated as process 304 in the process flow 300 as shown in FIG. 63. Protruding fins 24' and dummy fin 25' may also be referred to as active channel regions 24' and dummy channel region 25', respectively. The details for forming dielectric dummy strip 25 and dummy fin 25' are illustrated in detail in the embodiments shown in FIGS. 10-13, 14-16, 18-21, and 22-25, which will be discussed in subsequent paragraphs. In accordance with some embodiments of the present disclosure, the material of dummy strip 25 includes a silicon-based dielectric material such as SiN, SiON, SiOCN, SiC, SiOC, $SiO_2$, or the like. In accordance with alternative embodiments of the present disclosure, the material of dummy strip 25 includes a metal-based dielectric material (oxide or nitride) such as TaN, TaO, HfO, or the like. The bottom surface of dielectric dummy strip 25 may be higher than, level with, or lower than, the top surfaces of STI regions 22, and may be level with or higher than the bottom surfaces of STI regions 22. Dummy fin 25 may have a single-layer structure or a multi-layer structure having a plurality of layers formed of different materials.

In accordance with some embodiments, the recessing of STI regions 22 to form protruding semiconductor fins 24' and dielectric dummy fin 25' may be performed using a dry etching process, wherein $HF_3$ and $NH_3$, for example, are used as the etching gases. In accordance with alternative embodiments, the recessing of STI regions 22 is performed through a wet etching process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
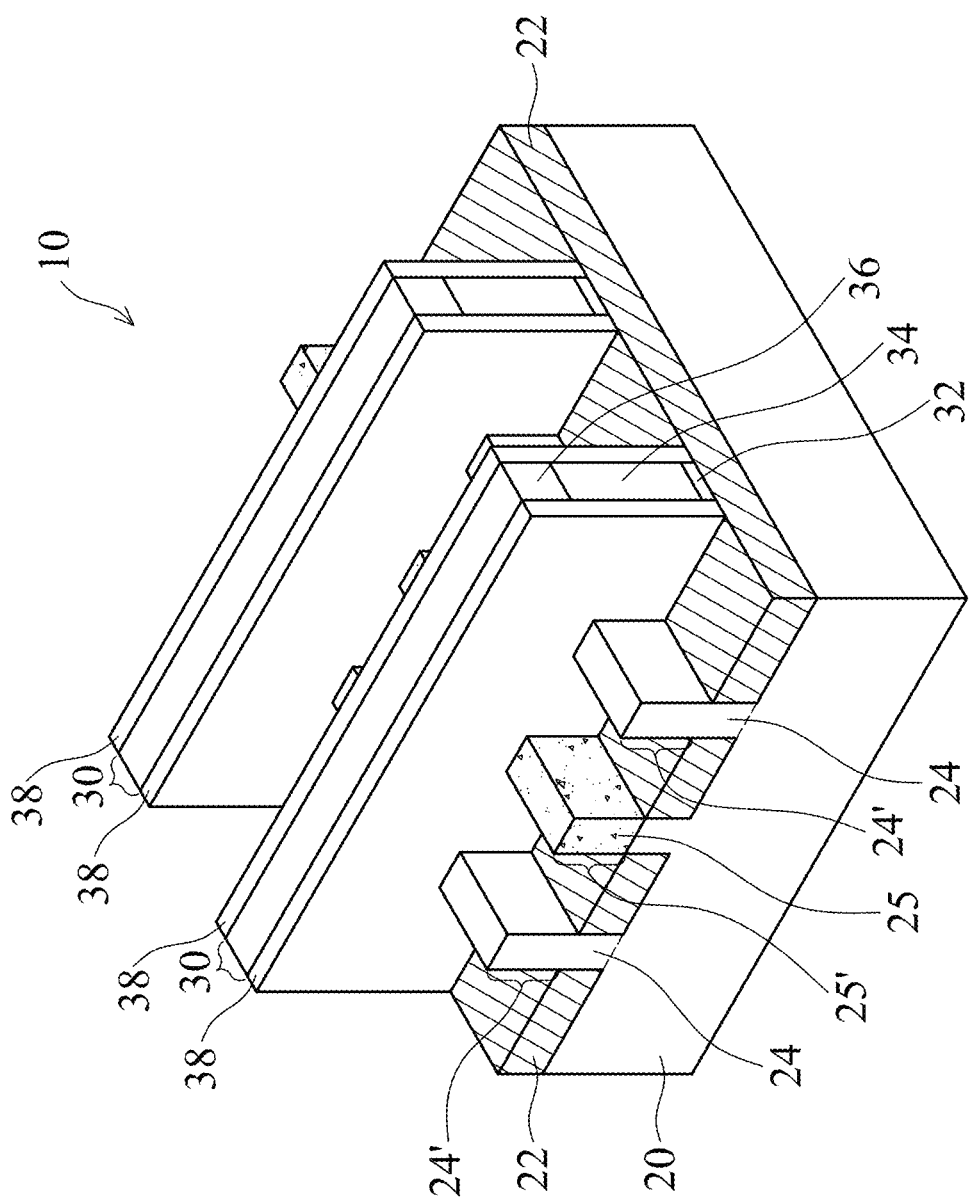

Referring to FIG. 3, dummy gate stacks 30 are formed on the top surfaces and the sidewalls of protruding fins 24' and dummy fin 25'. The formation of dummy gate stacks 30 may include selectively forming gate dielectrics 32 on some of protruding fins 24' and dummy fins 25', as will be discussed in detail in subsequent paragraphs. The respective process is illustrated as process 306 in the process flow 300 as shown in FIG. 63. Dummy fins 25' are thus alternatively referred to as dummy channels. Dummy gate electrodes 34 are formed over dummy gate dielectrics 32. The respective process is illustrated as process 308 in the process flow 300 as shown in FIG. 63. As will be discussed in detail in the embodiments shown in FIGS. 26 through 40, dummy gate dielectrics 32 may be selectively removed from the dummy fins 25' (refer to FIG. 7B). Gate dielectrics 32, which may be dummy gate dielectrics or real gate dielectrics in different device regions, however, are left on protruding fins 24'. Accordingly, on protruding fins 24', dummy gate electrodes 34 are formed on gate dielectrics 32, while on dummy fins 25', dummy gate electrodes 34 are in physical contact with dummy fins 25'.

Referring again to FIG. 3, Gate dielectrics 32 may be formed of or comprise silicon oxide, silicon nitride, or the like. Depending on the formation process, gate dielectrics 32 may or may not include horizontal portions on top of STI regions 22. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24', dummy fins 25', and STI regions 22. Dummy gate stacks 30 also have lengthwise directions perpendicular to the lengthwise directions of protruding fins 24'.

Next, as also shown in FIG. 3, gate spacers 38 are formed on the sidewalls of dummy gate stacks 30. The respective process is illustrated as process 310 in the process flow 300 as shown in FIG. 63. In accordance with some embodiments of the present disclosure, gate spacers 38 are formed of a dielectric material such as silicon nitride, silicon oxide, silicon carbo-nitride, silicon oxy-nitride, silicon oxy-carbo-nitride, or the like, and may have a single-layer structure or a multi-layer structure including a plurality of dielectric layers.

Figure 4:
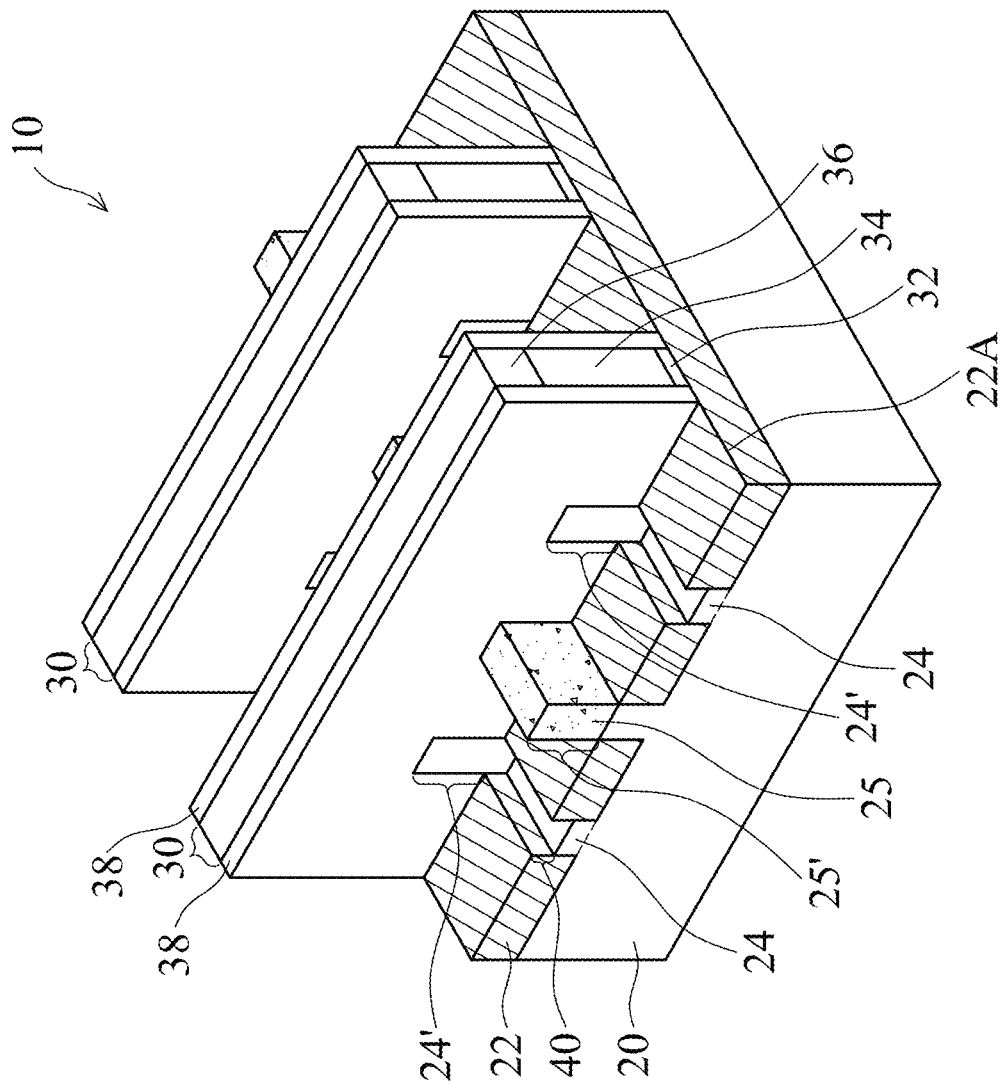

In accordance with some embodiments of the present disclosure, an etching step is performed to etch the portions of protruding fins 24' that are not covered by dummy gate stack 30 and gate spacers 38, resulting in the structure shown in FIG. 4. The respective process is illustrated as process 312 in the process flow 300 as shown in FIG. 63. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using the mixture of $NF_3$ and $NH_3$, the mixture of HF and $NH_3$, or the like.

Figure 5A:
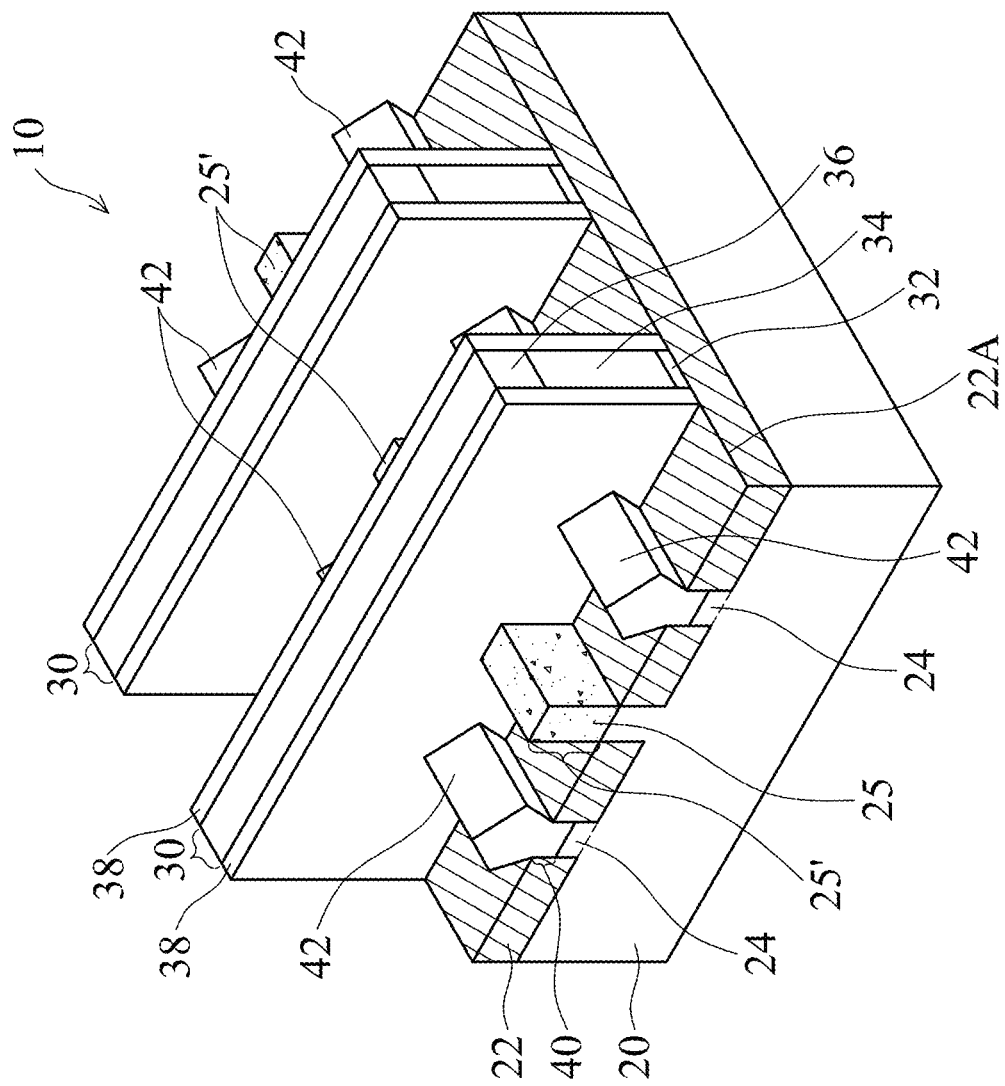

Next, epitaxy regions (source/drain regions) 42 are formed by selectively growing a semiconductor material from recesses 40, resulting in the structure in FIG. 5A. The respective process is illustrated as process 314 in the process flow 300 as shown in FIG. 63. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiB, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 may start expanding horizontally, and facets may be formed.

Figure 5B:
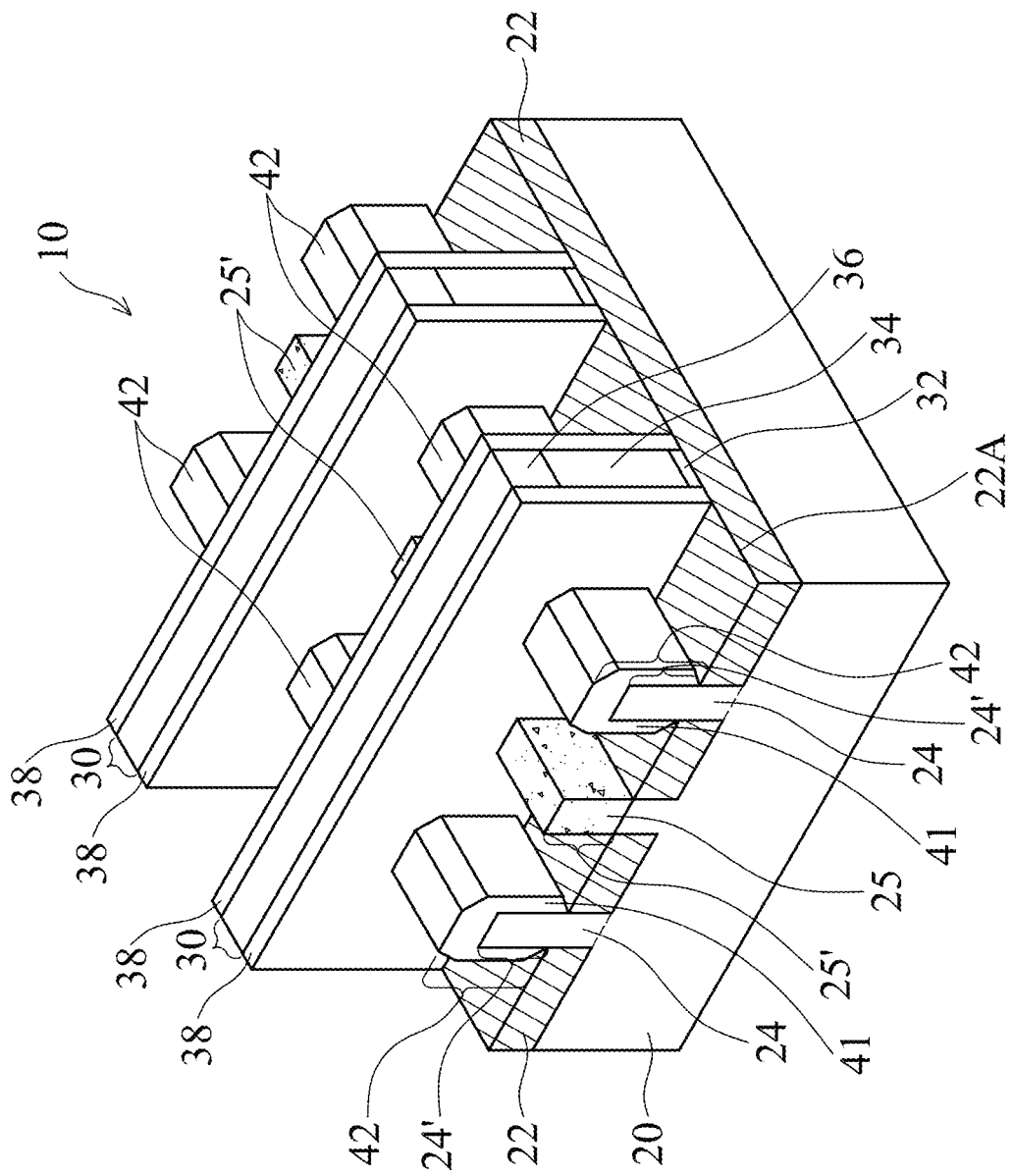

FIG. 5B illustrates the formation of cladding source/drain regions 42 in accordance with alternative embodiments of the present disclosure. In accordance with these embodiments, the protruding fins 24' as shown in FIG. 4 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy region 41. An implantation may (or may not) be performed to implant an n-type impurity or a p-type impurity.

Figure 6:
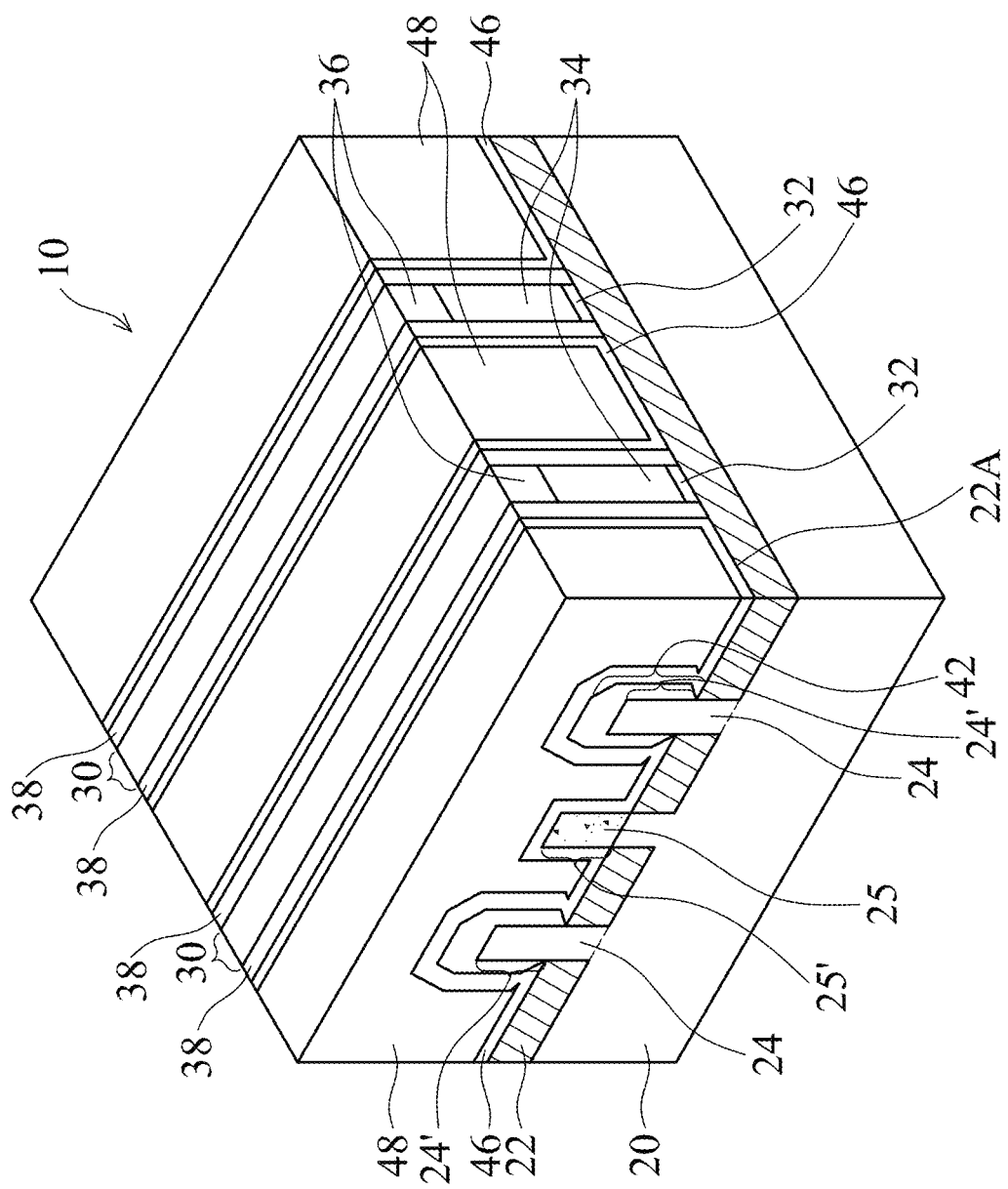

FIG. 6 illustrates a perspective view of the structure after the formation of Contact Etch Stop Layer (CESL) 46 and Inter-Layer Dielectric (ILD) 48. The respective process is illustrated as process 316 in the process flow 300 as shown in FIG. 63. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of or comprise an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process is performed to level the top surfaces of ILD 48, dummy gate stacks 30, and gate spacers 38 with each other. In accordance with some embodiments of the present disclosure, the planarization process stops on the top surfaces of hard masks 36. In accordance with alternative embodiments, hard masks 36 are also removed during the planarization process, and the planarization process stops on the top surfaces of dummy gate electrodes 34.

Figures 1, 7A:
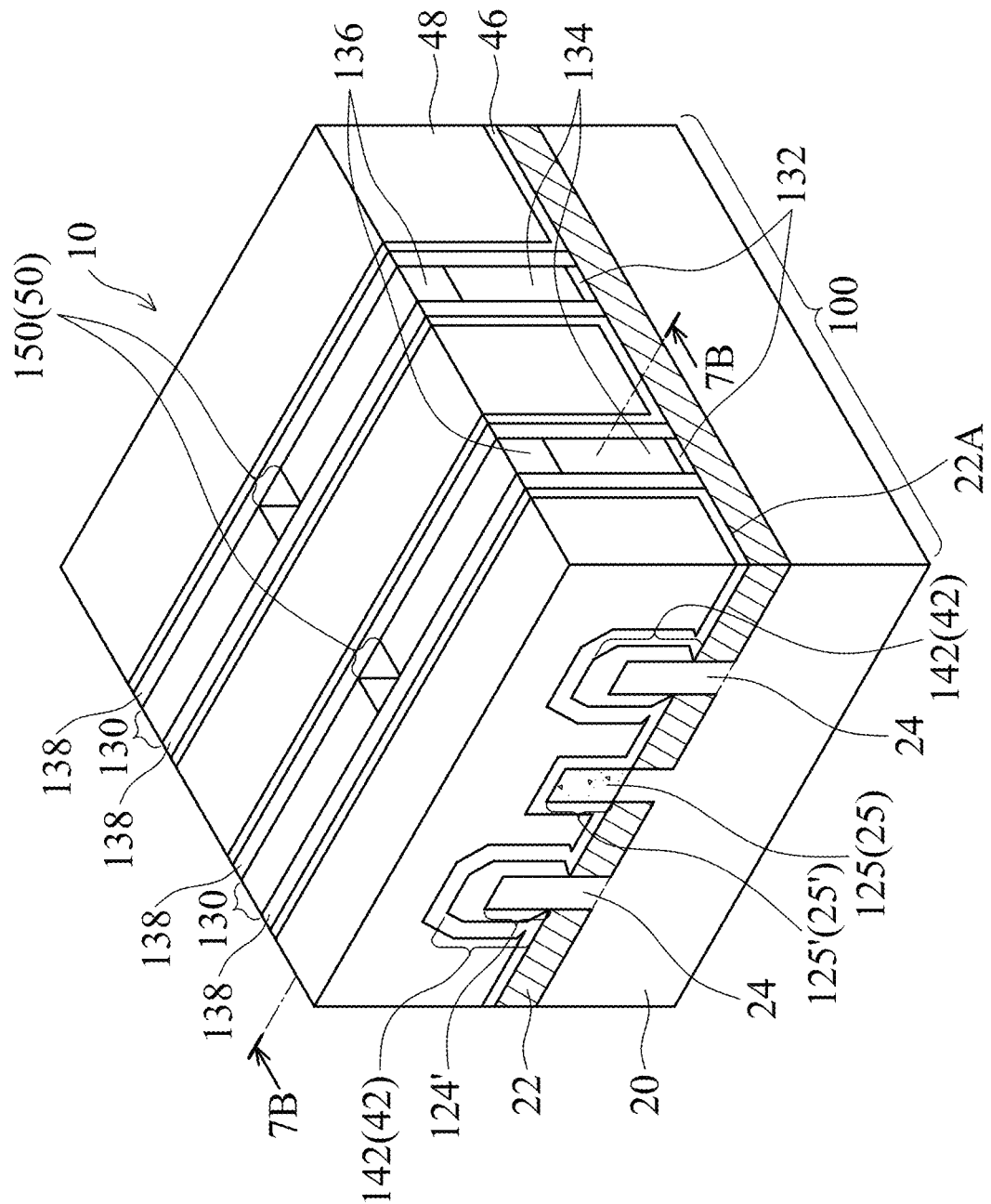
Figures 2, 7A:
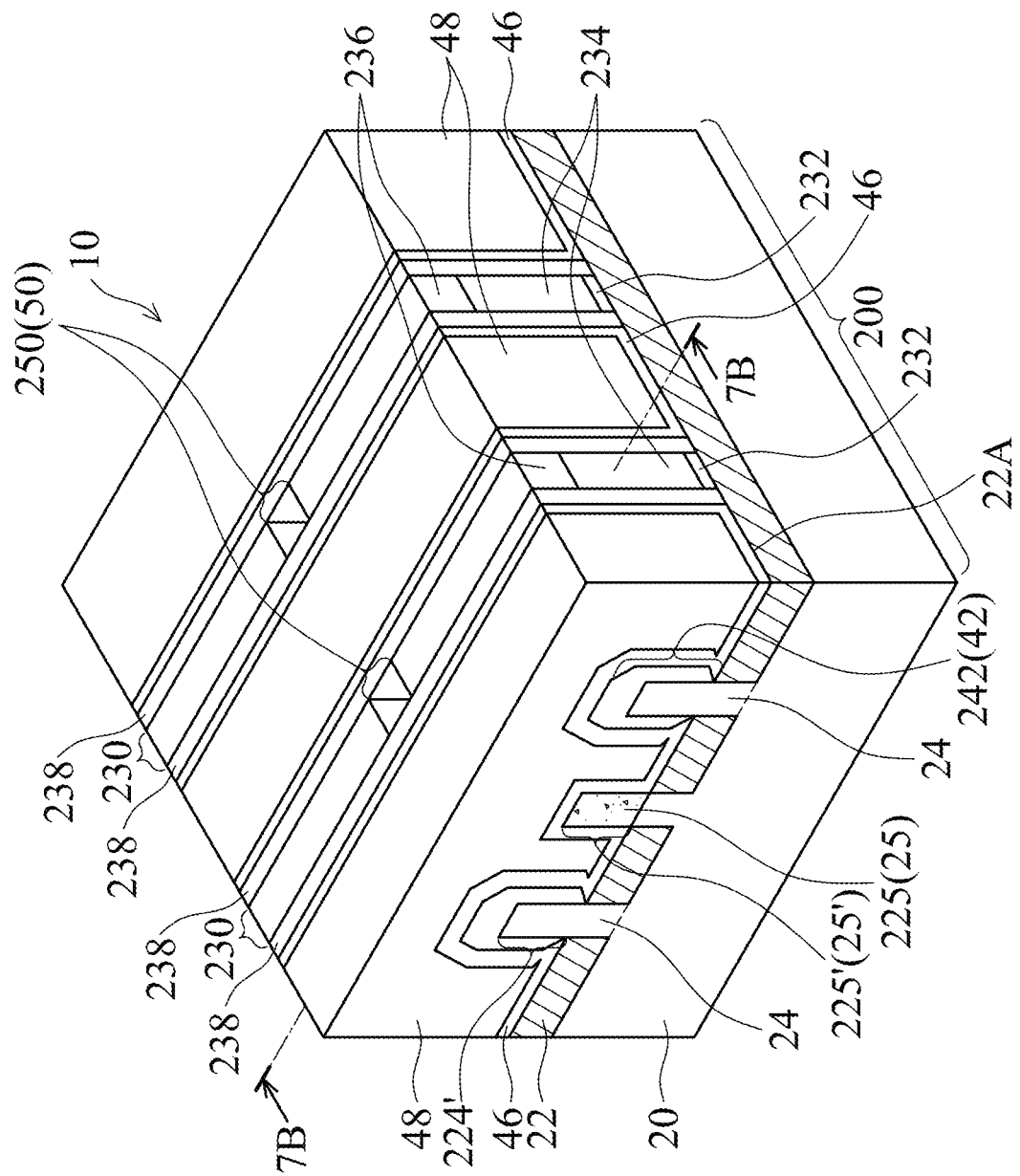

FIGS. 7A-1 and 7A-2 illustrate device regions 100 and 200, respectively, in wafer 10 (and in the same chip) and the structure formed therein. In accordance with some embodiments, device region 100 includes, and is not limited to, a core device region (sometimes referred to as a logic device region), and device region 200 includes, and is not limited to, an Input-Output (IO) device region. Accordingly, the FinFETs formed in device regions 100 and 200 may be a core FinFET and an IO FinFET, respectively in accordance with some example embodiments.

To distinguish the features in the device region 100 from the features in the device region 200, the features in the device region 100 may be represented using the reference numerals of the corresponding features in FIG. 6 plus number 100, and the features in the device region 200 may be represented using the reference numerals of the corresponding features in FIG. 6 plus number 200. For example, the source/drain regions 142 and 242 in FIGS. 7A-1 and 7A-2, respectively correspond to source/drain region 42 in FIG. 6. The features may also be denoted without adding number 1 or 2 in front of the feature reference number, either to indicate the feature may extend into both of device regions 100 and 200, or when distinction is not needed. The corresponding features in the device region 100 and the device region 200 may be formed in common processes.

Referring to FIGS. 7A-1 and 7A-2, a dummy-gate cutting process is performed by etching dummy gate stacks 130 and 230 to form openings 150 and 250, respectively, which are also collectively referred to as openings 50. The respective process is illustrated as process 318 in the process flow 300 as shown in FIG. 63. Each of dummy gate stacks 130 and 230 is thus separated into discrete portions. To perform the dummy-gate cutting process, an etching mask (not shown), which may include a photo resist, may be formed and patterned, and is then used to etch dummy gate stacks 130 and 230.

Figure 7B:
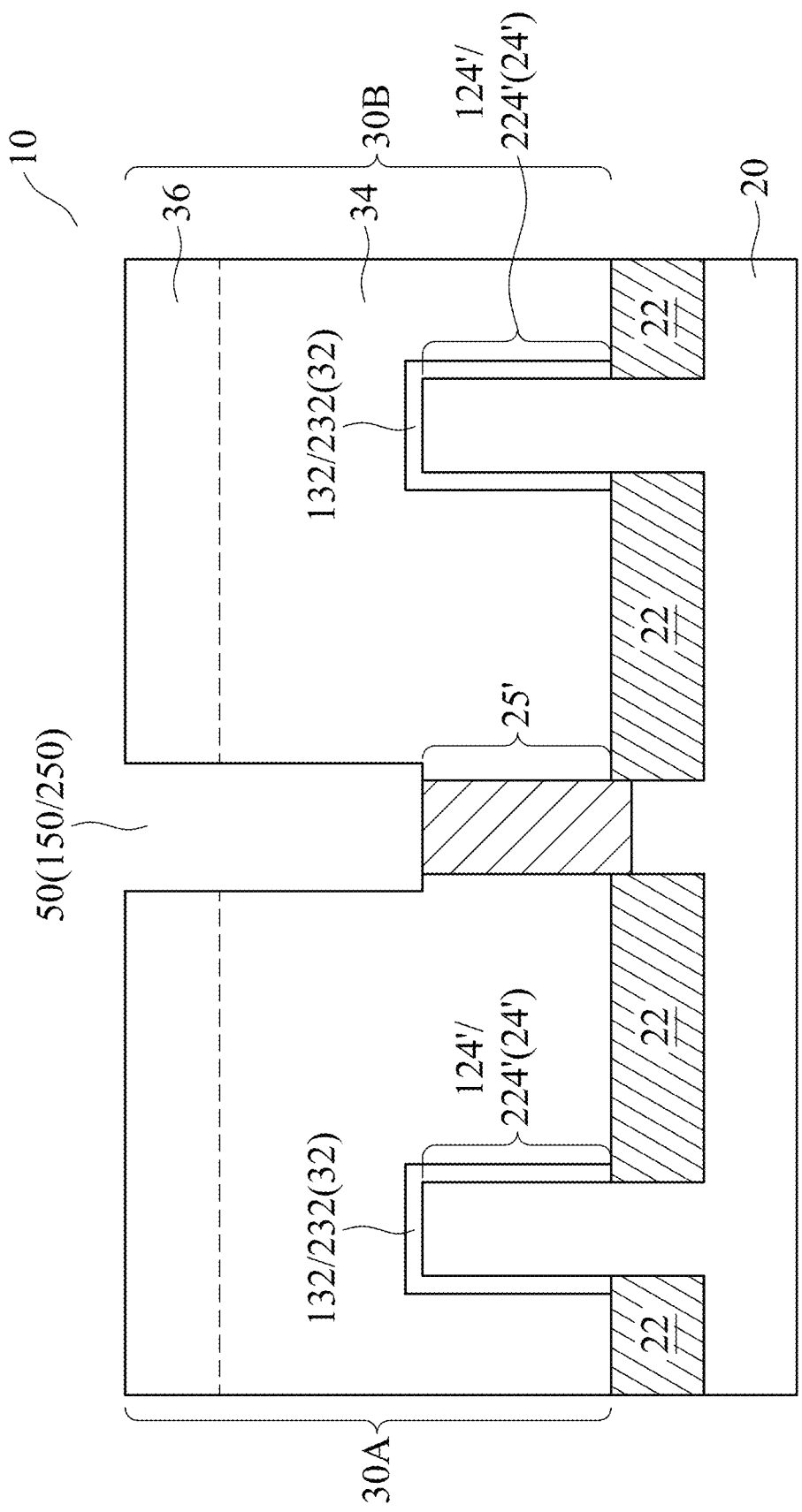

FIG. 7B illustrates a cross-sectional view obtained from the line 7B-7B as shown in either of FIGS. 7A-1 and 7A-2. In the dummy-gate cutting process, dummy gate stacks 30 are etched in anisotropic processes, until dielectric dummy fin 25' is exposed. As a result, a portion of dummy gate stack 30 is removed. A long dummy gate stack 30 is thus cut into two discrete portions 30A and 30B that are disconnected from each other. Each discrete portion 30A and 30B of dummy gate stack 30 may cross over one, two, or more protruding fins 24' in order to form a single-fin FinFET or a multi-fin FinFET. After the etching of dummy gate stacks 30, the etching mask is removed, for example, in an ashing process.

Figure 8A:
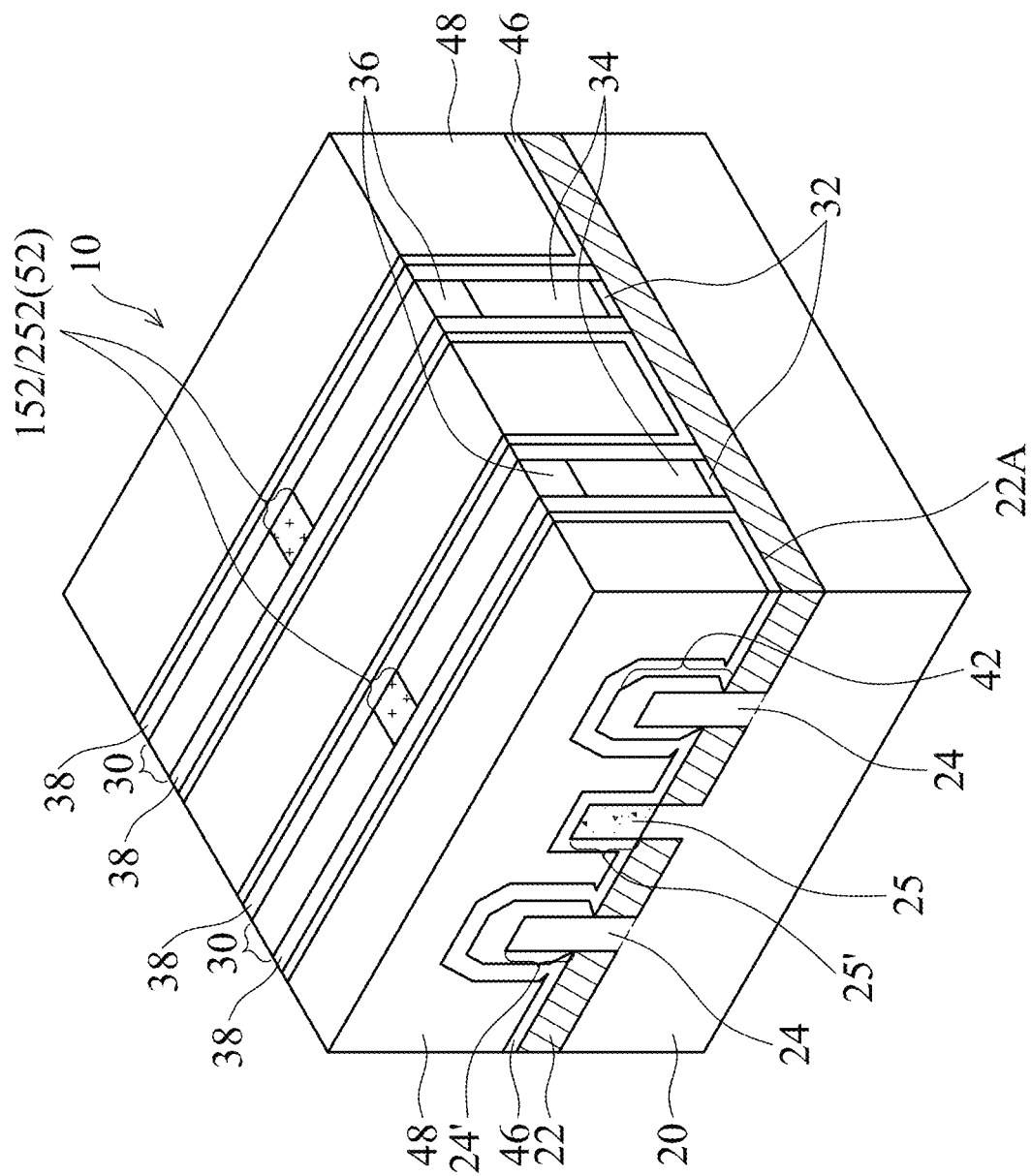
Figure 8B:
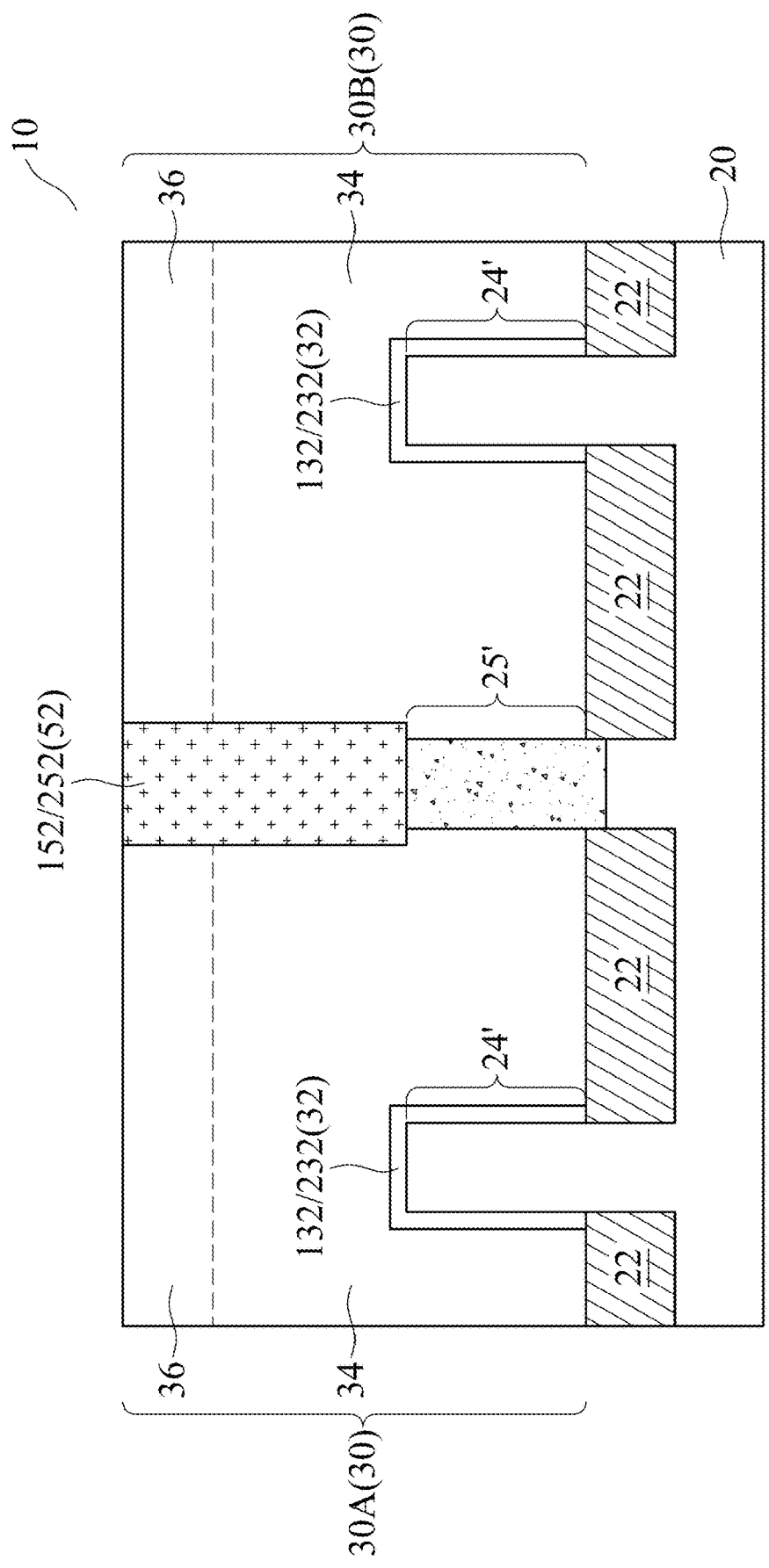

Next, openings 50 are filled by a dielectric region(s) to form gate isolation regions 152 and 252 (collectively referred to gate isolation regions 52), which are shown in FIGS. 8A and 8B. Gate isolation regions 152 and 252 are formed in device regions 100 and 200, respectively, and are shown separately in FIGS. 9A-1 and 9A-2, respectively. The respective process is illustrated as process 320 in the process flow 300 as shown in FIG. 63. The formation process includes depositing a dielectric material(s), and performing a planarization process such as a CMP process. The deposition process may be performed using a method selected from Atomic Layer Deposition (ALD), Plasma Enhanced Atomic Layer Deposition (PEALD), Low-Pressure Chemical Vapor Deposition (LPCVD), Chemical Vapor Deposition (CVD), Plasma enhanced Chemical Vapor Deposition (PECVD), Physical Vapor Deposition (PVD), or other applicable deposition methods. Gate isolation regions 152 and 252 may have a single-layer structure formed of a homogeneous dielectric material, or may have a multi-layer structure including a plurality of layers formed of different materials. The dielectric materials include, and are not limited to, oxide-based dielectric materials, nitride-based dielectric materials, oxynitride-based dielectric materials, oxycarbide-based dielectric materials, carbide-based dielectric materials, etc.

As aforementioned, gate dielectric 32 was removed from dummy fin 25'. Accordingly, gate isolation regions 52 physically contact dummy fin 25'. On the other hand, protruding semiconductor fins 24' still have gate dielectrics 32 formed thereon.

Figure 29:
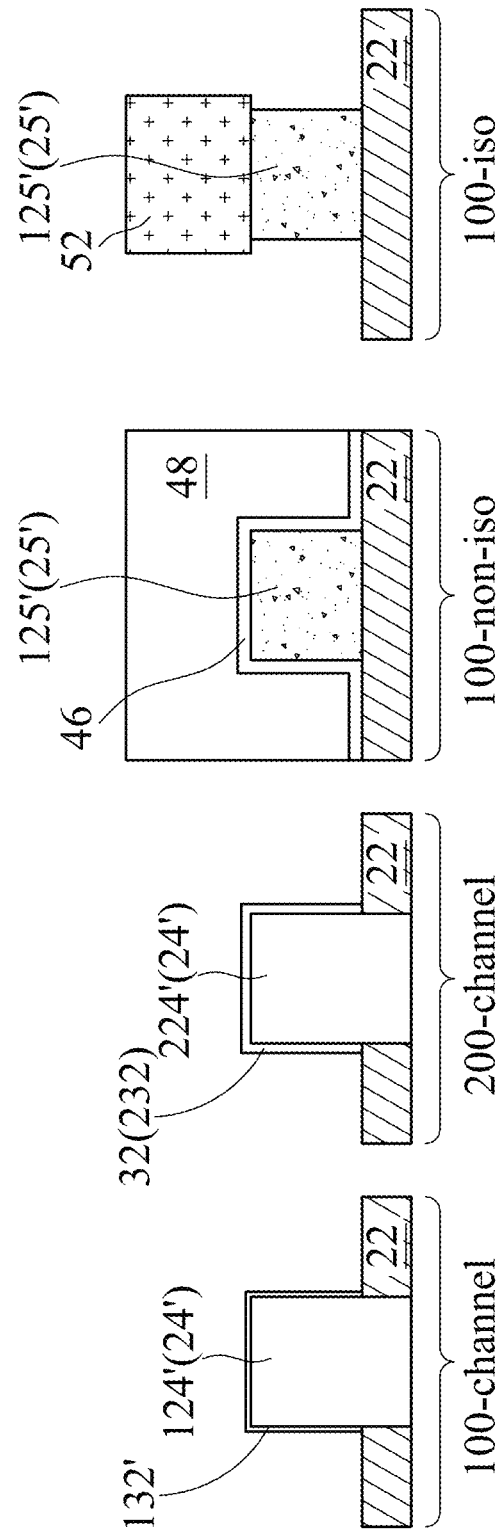
Figure 34:
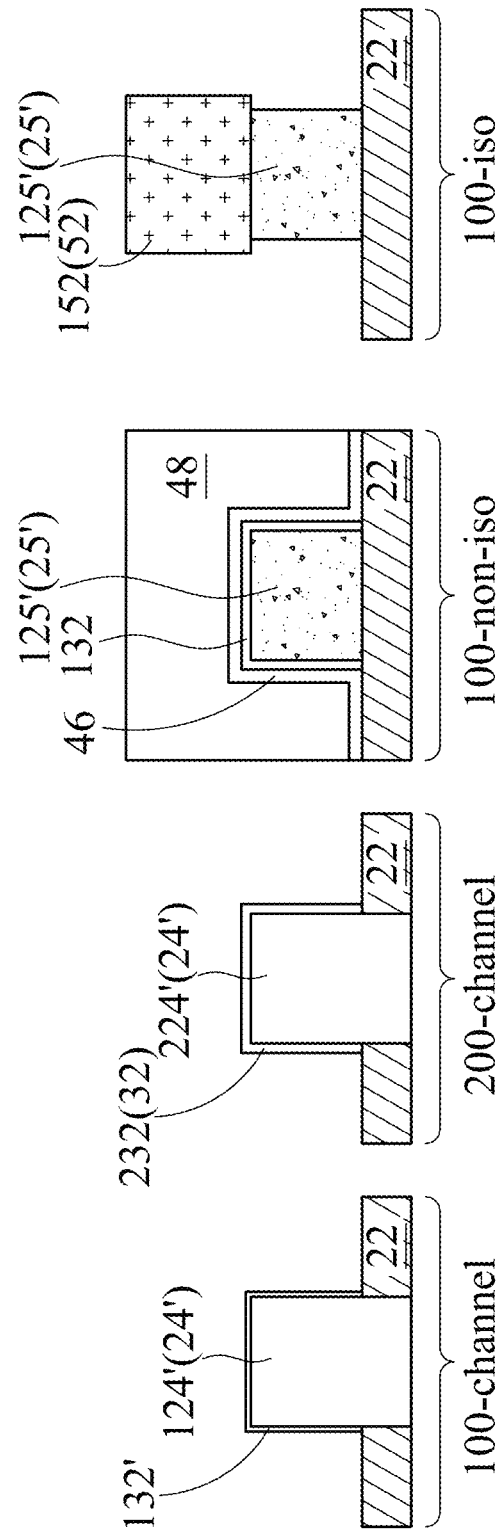
Figure 39:
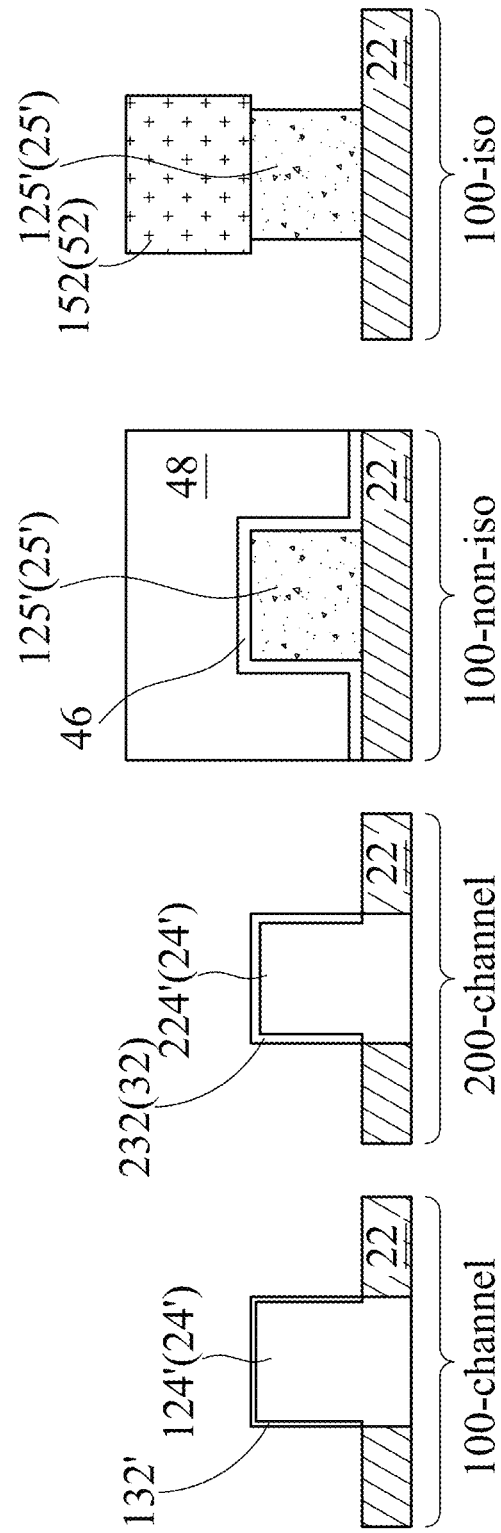

Dummy gate stacks 30A and 30B are then etched, and hard masks 36 and gate electrodes 34 are removed. In device region 100, gate dielectric 32 is removed (and hence was a dummy gate dielectric) and replaced by a core gate oxide, while in device region 200, gate dielectric 32 is not removed during this process, and is exposed after the removal of dummy gate electrodes 34 as shown in FIGS. 29, 34, and 39, which will be discussed in detail in subsequent paragraphs.

Figures 1, 9A:
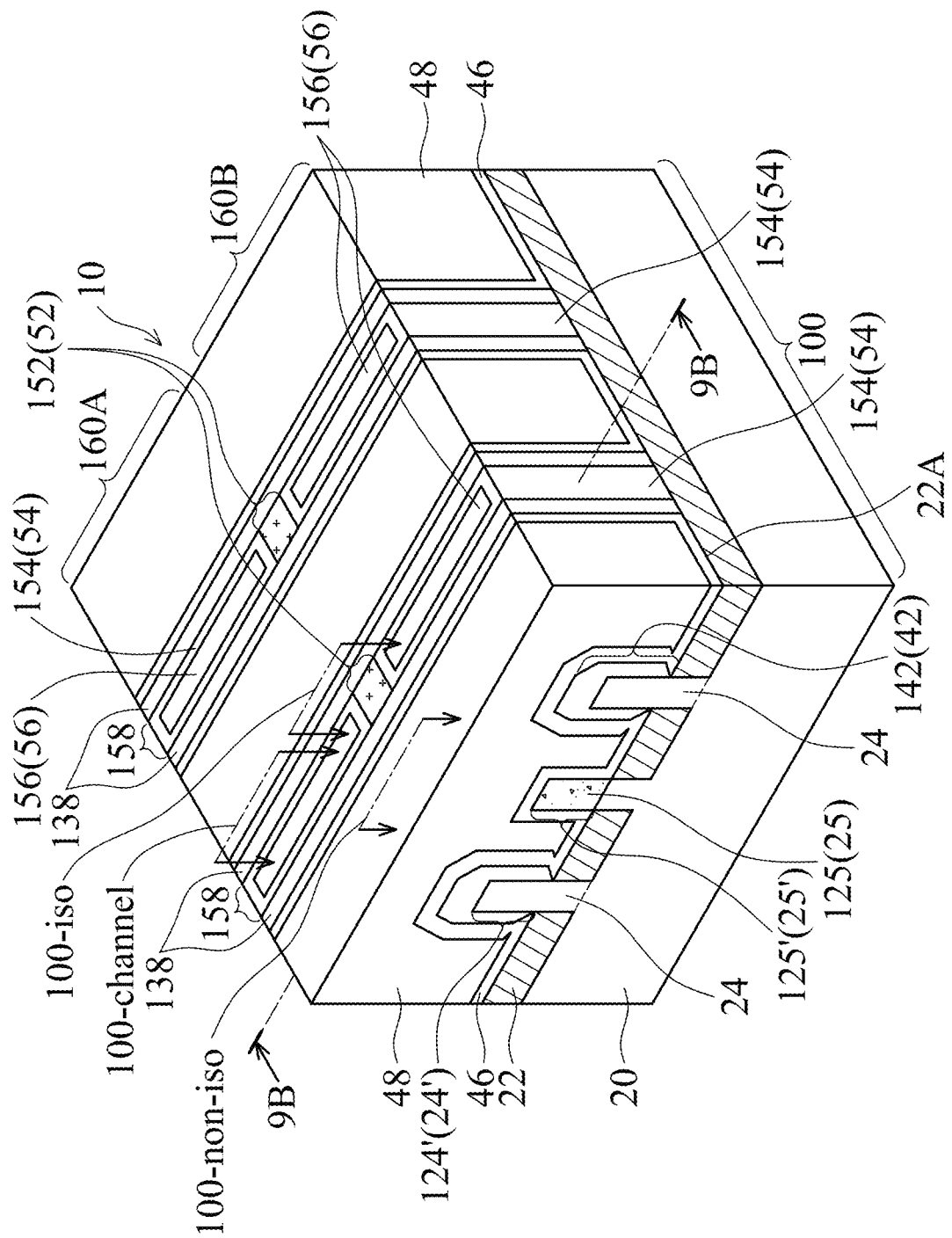
Figures 2, 9A:
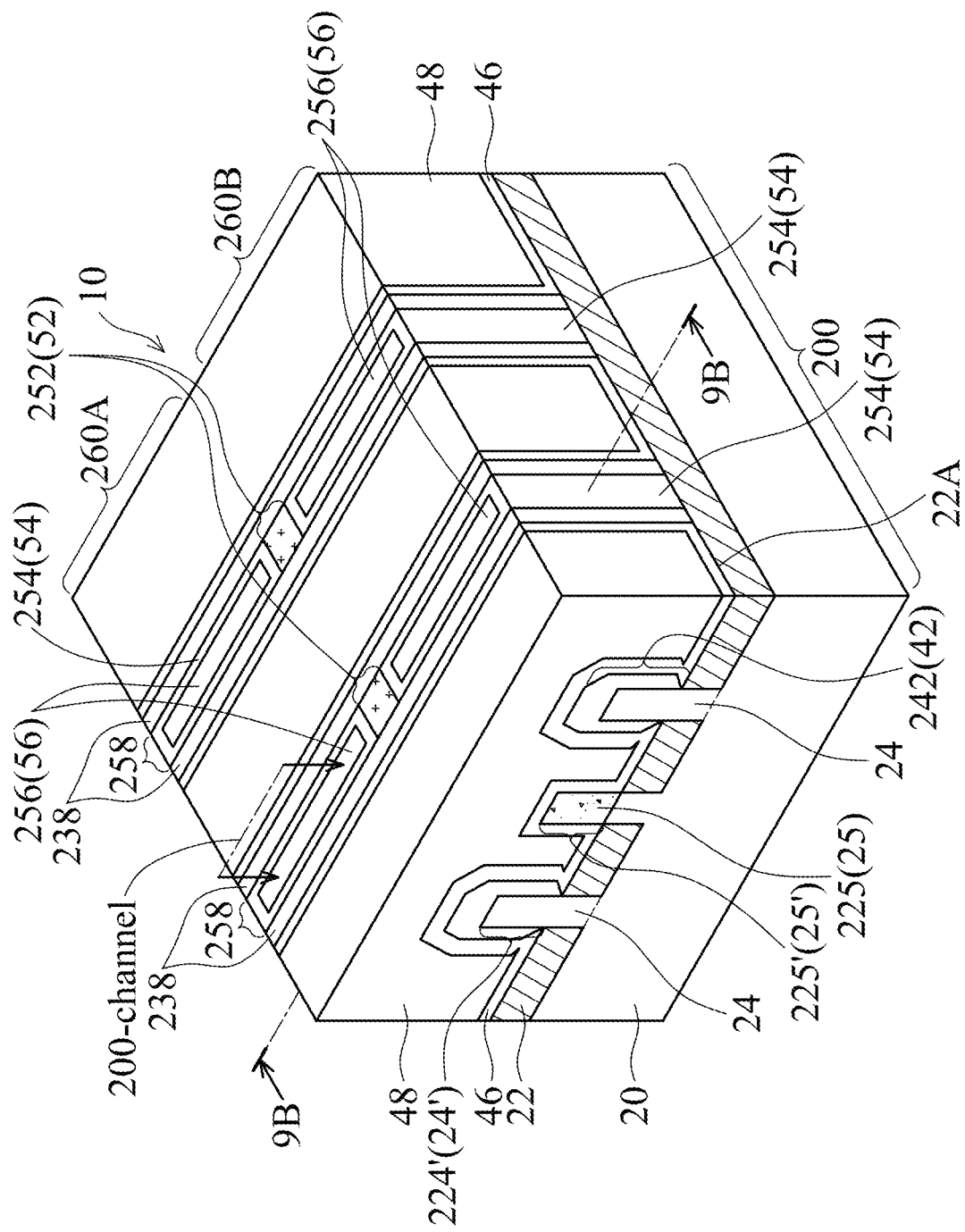
Figure 9B:
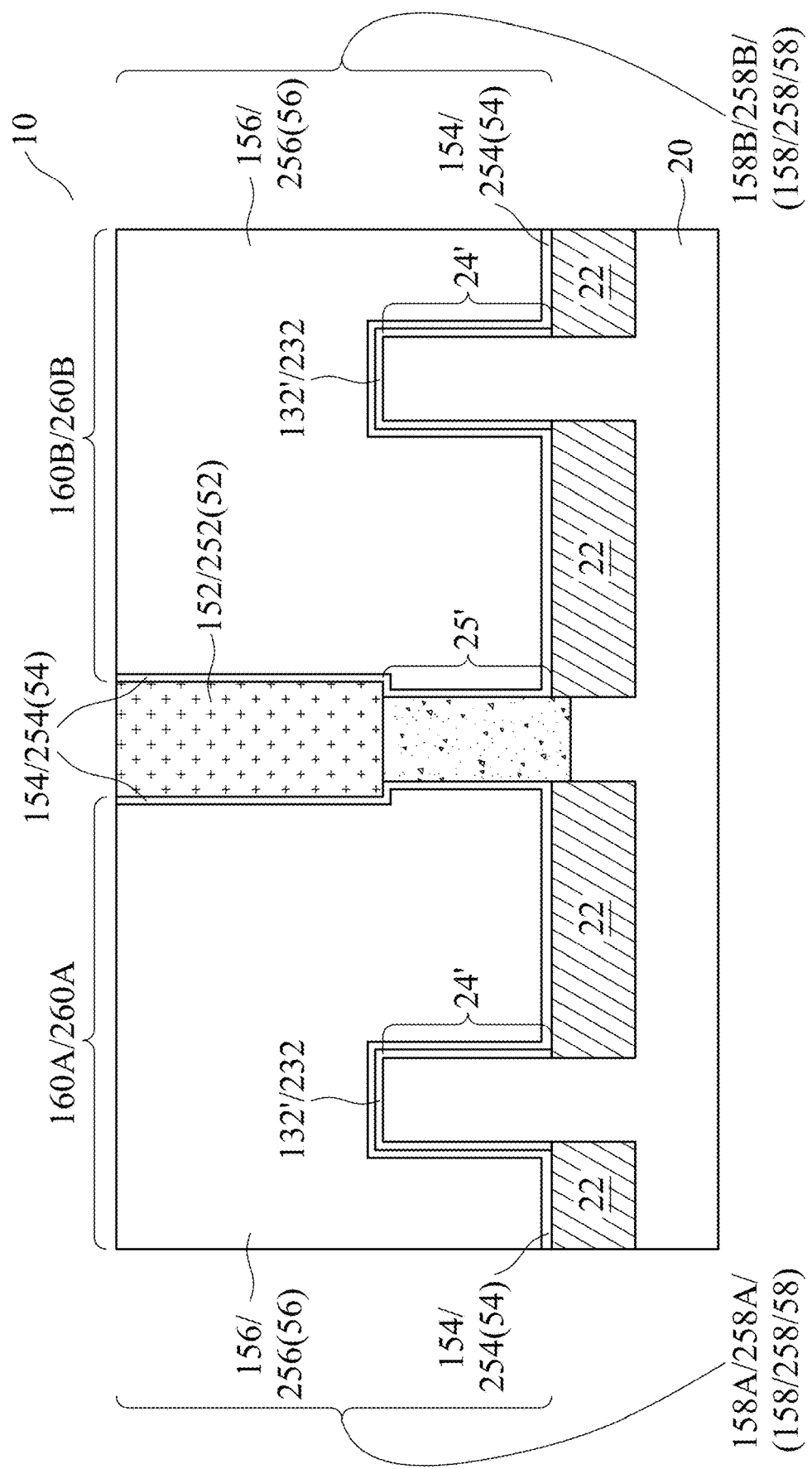

Replacement gate stacks 158 and 258 (collectively referred to as 58) are then formed in device regions 100 and 200, respectively. The respective process is illustrated as process 322 in the process flow 300 as shown in FIG. 63. The resulting structure is shown in FIGS. 9A-1, 9A-2, and 9B. Gate stacks 158 and 258 include high-k dielectric 154 and 254 (collectively referred to as 54) and replacement gate electrodes 156 and 256 (collectively referred to as 56). High-k dielectrics 54 may be formed of hafnium oxide, zirconium oxide, lanthanum oxide, or the like. Gate electrodes 64 may have a composite structure including a plurality of layers formed of TiN, TaN, TiAl, TaAlC, Co, Al, and/or the like. The respective metals and the structure are selected so that the resulting replacement gate electrodes 156 and 256 have appropriate work functions. FinFETs 160A and 160B are thus formed in device region 100, as shown in FIGS. 9A-1 and 9B. FinFETs 260A and 260B are also formed in device region 200, as shown in FIGS. 9A-2 and 9B.

The preceding figures illustrate a brief process flow for forming dummy fins 25' and the corresponding FinFETs. In subsequent figures and paragraphs, the details of some of the processes as briefly addressed in preceding figures are illustrated and discussed.

FIGS. 10-13, 14-17, 18-21, and 22-25 illustrate the details in the formation of dummy strips 25 and dummy fins 25' in accordance with some embodiments. The processes as shown in FIGS. 10-13, 14-17, 18-21, and 22-25 may correspond to the processes shown in FIGS. 1 and 2. It is appreciated that FIGS. 10-25 illustrate the features in region 11 in FIG. 2, and the underlying features such as STI regions 22 and substrate 20 are not illustrated. These features may be identified referring to FIGS. 1 and 2.

Figure 10:
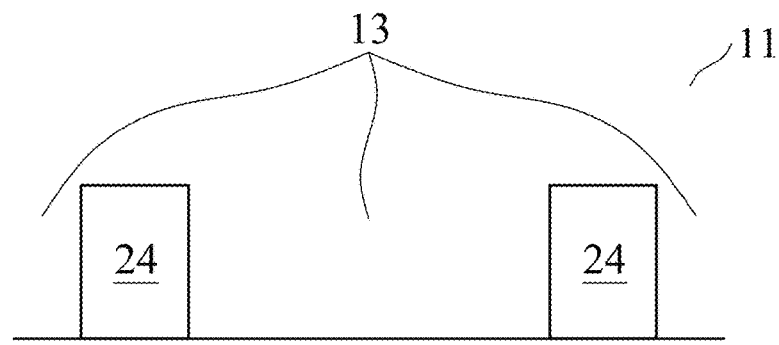
FIGS. 10-13, 14-17, 18-21, and 22-25 illustrate intermediate stages of various embodiments in the formation of dielectric dummy fins in accordance with some embodiments.
Figure 11:
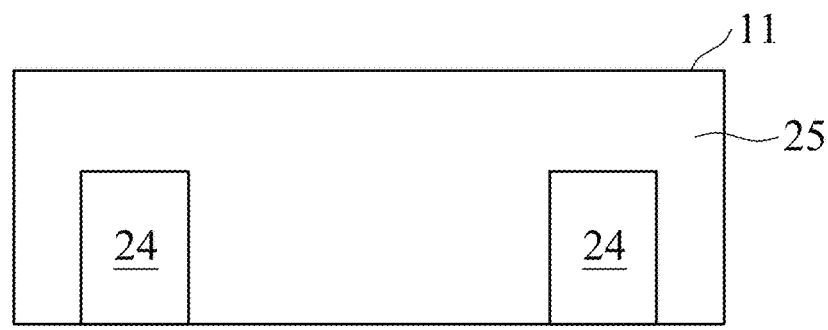
Figure 12:
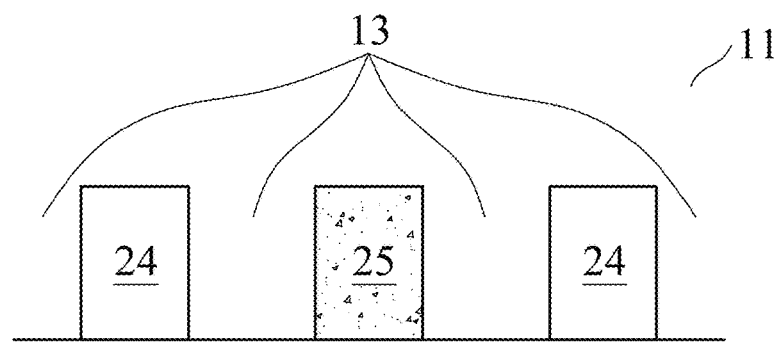
Figure 13:
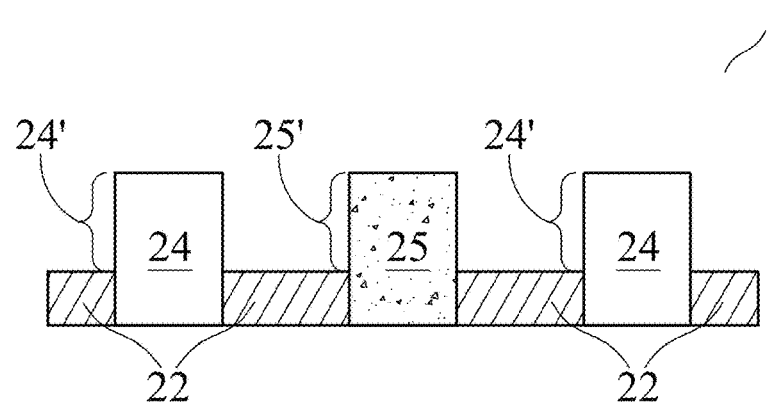

FIGS. 10 through 13 illustrate the formation of dummy strips 25 through deposition and patterning. Referring to FIG. 10, semiconductor strips 24 are formed by etching substrate 20, and trenches 13 are formed between semiconductor strips 24. The structure shown in FIG. 10 is formed before the formation of STI regions 22 as shown in FIG. 1. Next, referring to FIG. 11, dielectric layer 25 is formed through deposition, followed by a planarization process to planarize its top surface. The material of dielectric region 25 has been discussed referring to FIG. 2. Dielectric layer 25 is patterned to form dummy dielectric strip 25, as shown in FIG. 12. Before the patterning process, an etch-back process may be performed to lower the top surface of dielectric region 25. In a subsequent process, STI regions 22 are formed to fill trenches 13, and are then recessed, so that protruding fins 24' and dummy fin 25' are formed. It is appreciated that the order of the processes shown in FIGS. 14-17 is slightly different from the order of the processes shown in FIGS. 1 and 2 regarding whether STI regions 22 are formed first or whether dummy dielectric strip 25 is formed first.

Figure 14:
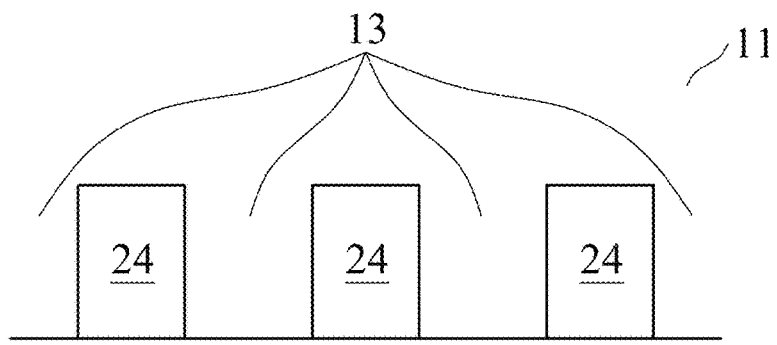
Figure 15:
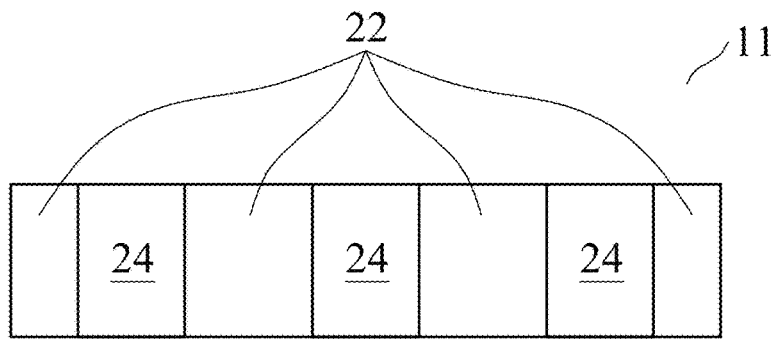
Figure 16:
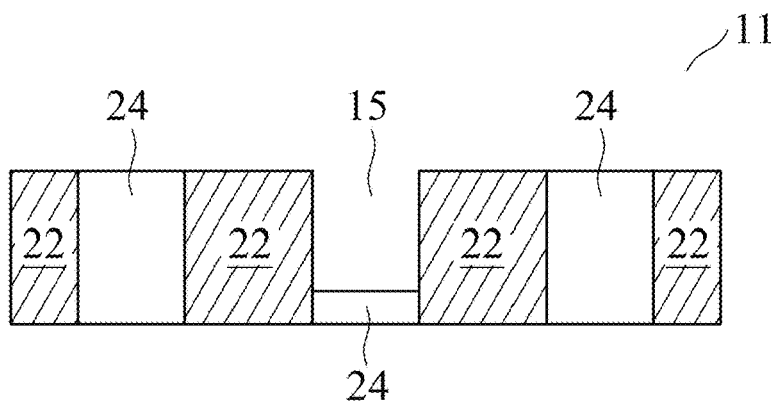
Figure 17:
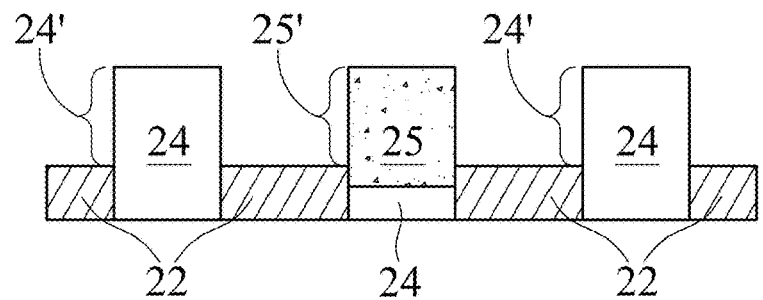

FIGS. 14 through 17 illustrate the formation of dummy strips 25 and dummy fin 25' in accordance with alternative embodiments, in which semiconductor strip 24 is etched and then refilled. FIG. 14 and FIG. 15 illustrate the process for forming the structure shown in FIG. 1. In FIG. 14, substrate 20 is etched to form semiconductor strips 24, with trenches 13 formed between semiconductor strips 24. Next, trenches 13 are filled to form STI regions 22. FIG. 16 illustrates the recessing of semiconductor strip 24 to form trench 15 between neighboring STI regions 22. In a subsequent process, a dielectric material is filled into trench 15 to form dummy strip 25, followed by the recessing of STI regions 22 to form protruding fins 24' and dummy fin 25'.

Figure 18:
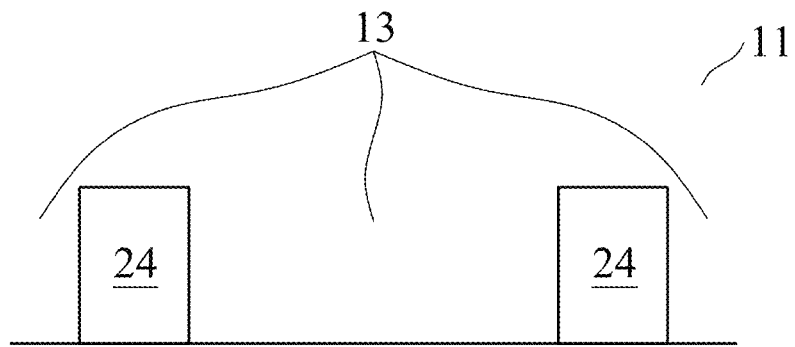
Figure 19:
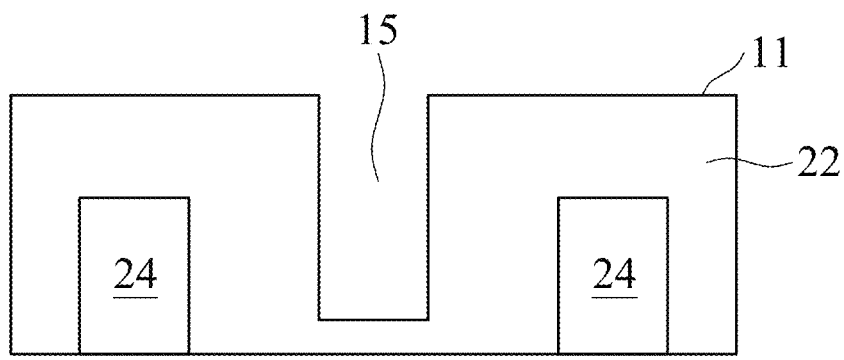
Figure 20:
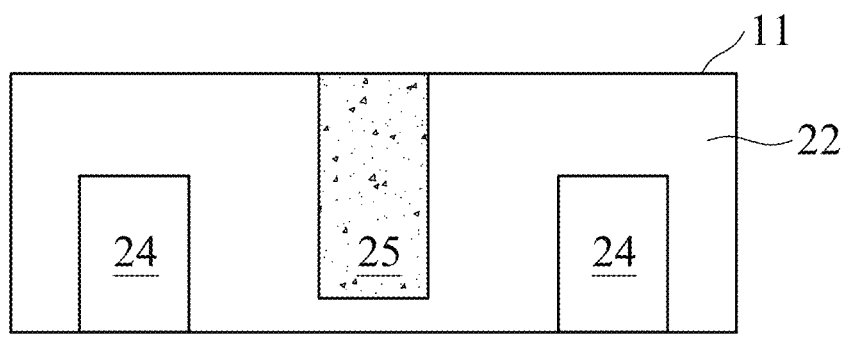
Figure 21:
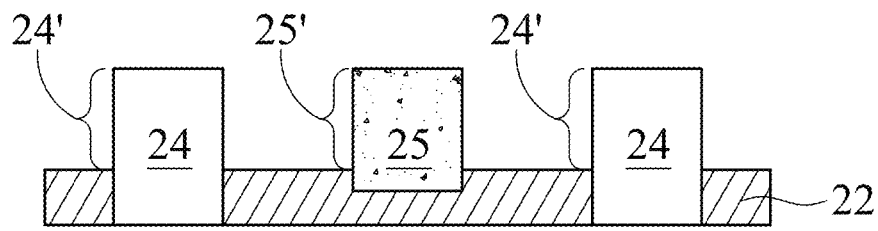

FIGS. 18 through 21 illustrate the formation of dummy strips 25 in accordance with alternative embodiments, wherein the formation process includes the conformal deposition of STI regions 22 and a dielectric filling process. FIG. 18 illustrates the formation of semiconductor strips 24 and trenches 13, which involves etching semiconductor substrate 20 to form semiconductor strips 24, with trenches 13 formed between semiconductor strips 24. In FIG. 19, a dielectric material is deposited. The dielectric material is the same material for forming STI regions 22, and hence is referred to as dielectric material 22. In accordance with some embodiments, dielectric material 22 is formed using a conformal deposition method such as ALD, CVD, or the like, so that the surfaces of dielectric material 22 follow the topology of protruding fins 24'. Accordingly, trench 15 is formed in dielectric material 22. In FIG. 20, dummy strip 25 is formed in STI region 22, which involves a deposition process, a planarization process, and an etch-back process. Dummy strip 25 and STI regions 22 are formed of different dielectric materials. FIG. 21 illustrates the etch-back of dummy strip 25 and the recessing of STI regions 22 to form protruding fins 24' and dummy fin 25'. In the resulting structure, dummy strip 25 is formed directly on top of a portion of STI region 22.

Figure 22:
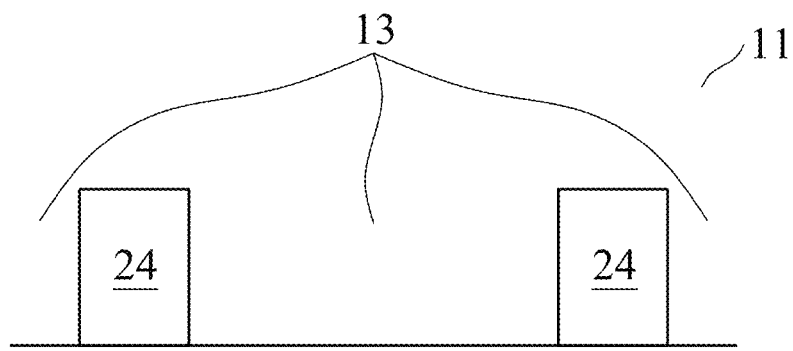
Figure 23:
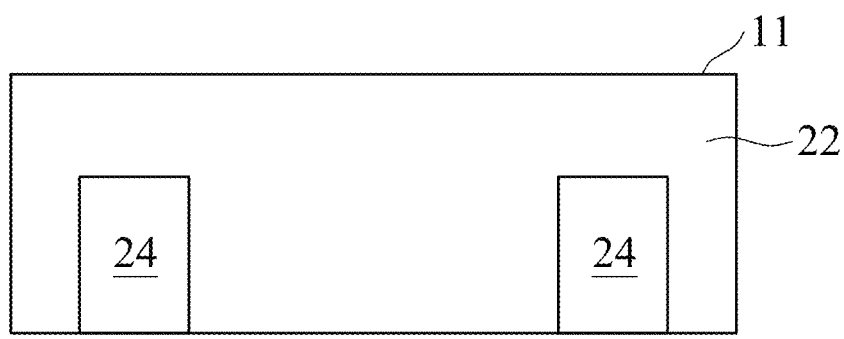
Figure 24:
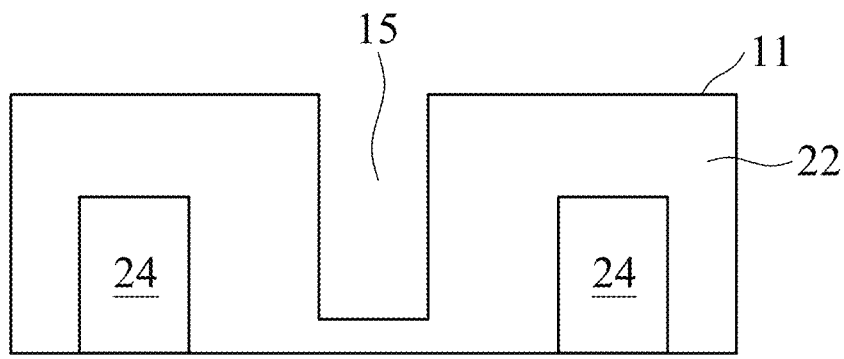
Figure 25:
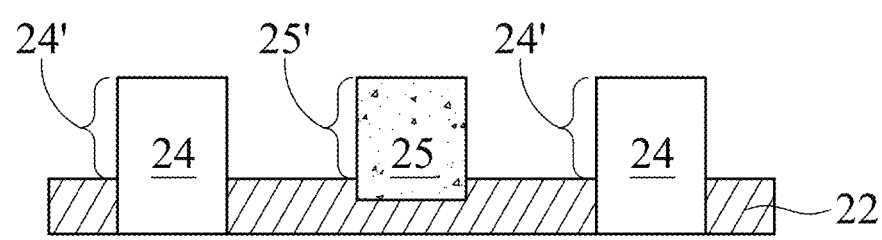

FIGS. 22 through 25 illustrate the formation of dummy strip 25 and dummy fin 25' in accordance with alternative embodiments, in which the dielectric layer for forming STI region 22 is etched and filled. FIG. 22 illustrates the formation of semiconductor strips 24 and trenches 13, which formation process involves etching semiconductor substrate 20 to form semiconductor strips 24, with trenches 13 formed between semiconductor strips 24. The process is essentially the same as shown in FIG. 10. In FIG. 23, a dielectric material is deposited. The dielectric material is the same material for forming STI regions 22, and hence is referred to as dielectric material 22. Next, trench 15 is formed by etching dielectric material 22, as shown in FIG. 24. Next, dummy strip 25 (FIG. 25) is formed in trench 15. The formation of dummy strip 25 may include a deposition process, a planarization process, and an etch-back process. Dummy strip 25 and STI regions 22 are formed of different dielectric materials. Dielectric material 22 is then etched back to form the STI regions 22 as shown. In accordance with these embodiments, dummy strip 25 is formed directly over a portion of STI region 22.

FIGS. 26-30, 31-35, and 36-40 illustrate several different embodiments, which include the formation of dummy gates and the replacement of the dummy gates with replacement gates, and the formation of gate isolation regions 52 on dummy fin 25'. The processes shown in these FIGS. 26-40 correspond to the processes shown in FIGS. 3-4, 5A, 5B, 6, 7A-1, 7A-2, 7B, 8A, 8B, 9A-1, 9A-2, and 9B. In each of the FIGS. 26-30, 31-35, and 36-40 and the subsequent figures, four regions and the corresponding cross-sectional views are obtained and shown in each of the figures. The cross-sectional views are obtained from regions 100-channel, 200-channel, 100-non-iso, and 100-iso. The cross-section 100-channel is obtained from the channel in device region 100, as shown in FIG. 9A-1. The cross-section 200-channel is obtained from the channel in device region 200, as shown in FIG. 9A-2. The cross-section 100-non-iso is obtained from a part of device region 100 that passes through dummy fin 25', and does not pass through gate isolation region 52, as shown in FIG. 9A-1. The cross-section 100-iso passes through gate isolation region 52, as shown in FIG. 9A-1.

Figure 26:
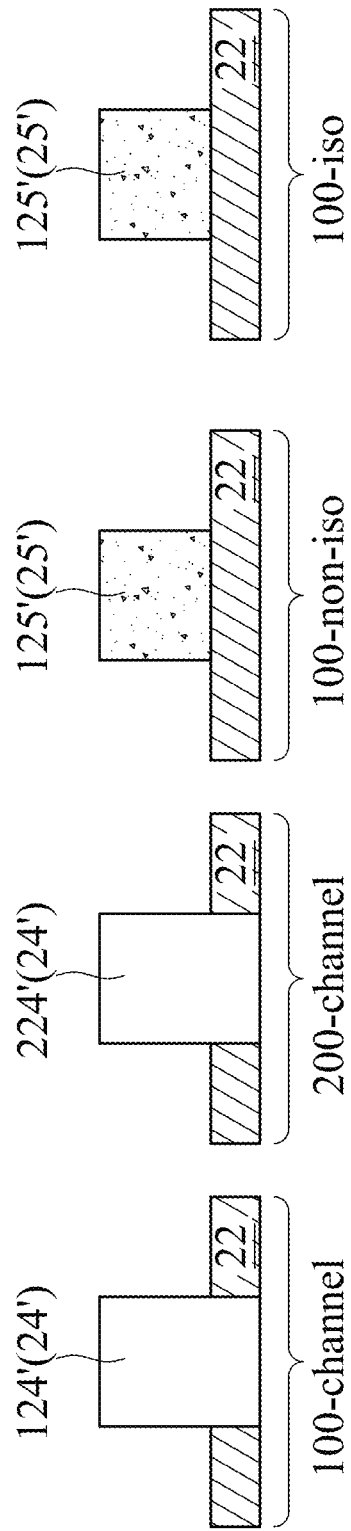
FIGS. 26-30, 31-35, and 36-40 illustrate intermediate stages of various embodiments in the selective formation and removal of dummy gate dielectric and the formation of gate isolation regions in accordance with some embodiments.
Figure 27:
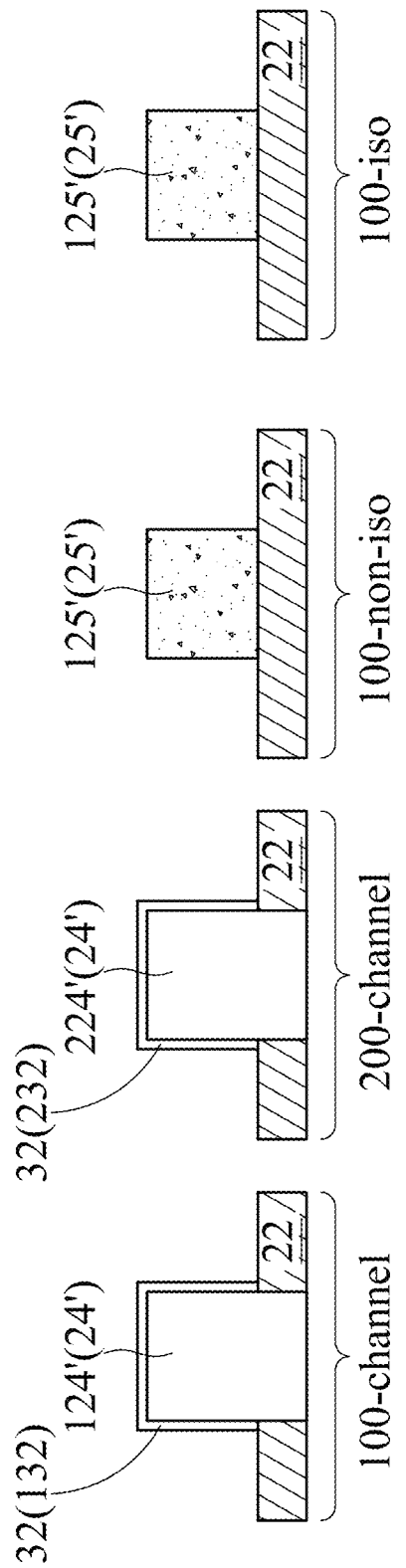

FIGS. 26-30 illustrate the cross-sections of a formation process in accordance with some embodiments. Referring to FIG. 26, protruding fins 24' and dummy fins 25' are formed. The structure also corresponds to the structure shown in FIG. 2. Next, referring to FIG. 27, dummy gate dielectrics 32 are selectively formed on protruding fins 24', and not on dummy fins 25'. This process corresponds to the process shown in FIG. 3. The processes for forming the structure shown in FIG. 27 are shown in detail in the embodiments shown in FIGS. 41-44. The material of dummy gate dielectric 32 may include silicon oxide, silicon nitride, silicon oxynitride, or other applicable dielectric materials.

Figure 28:
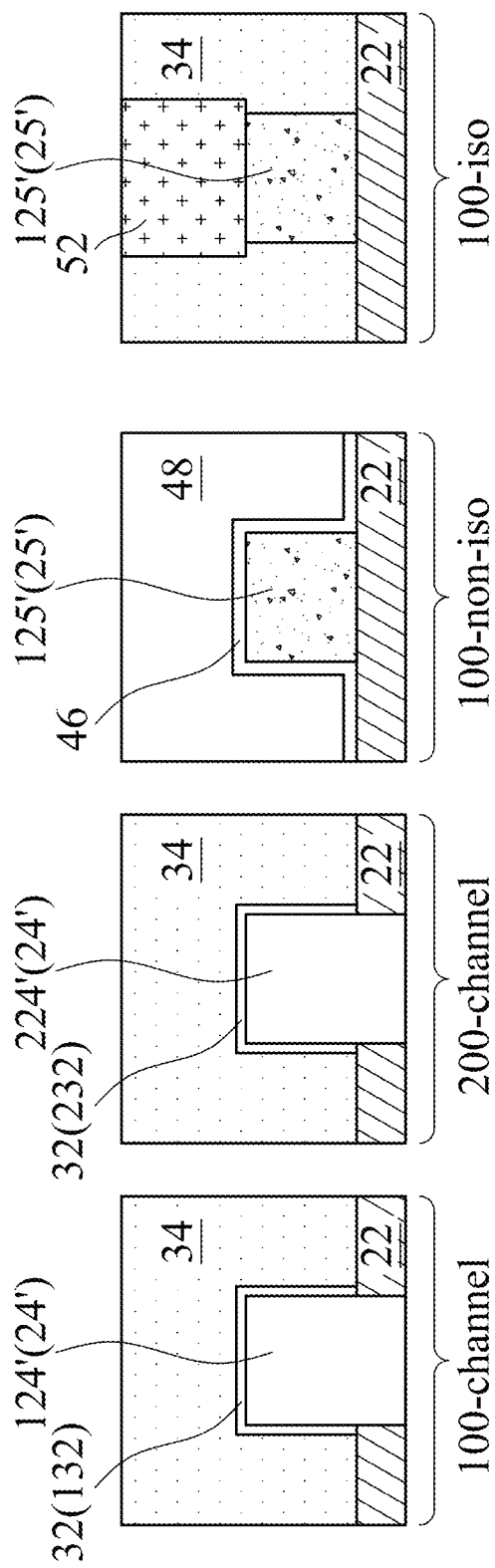

FIG. 28 illustrates the formation of dummy gate electrode 34, which may be formed of or comprise polysilicon, amorphous silicon, or other types of materials. This process also corresponds to the process shown in FIG. 3. It is appreciated that in cross-sections 100-channel and 200-channel, dummy gate electrodes 34 are separated from the corresponding protruding fins 24' by gate dielectrics 32, while in cross-section 100-iso, dummy gate electrode 34 is in physical contact with dummy fin 25'. Next, as also shown in FIG. 28, CESL 46 and ILD 48 are formed, and gate isolation region 52 is formed in dummy gate electrode 34 to contact the underlying dummy fin 25'. This process corresponds to the processes shown in FIGS. 7A-1, 7A-2, 7B, 8A, and 8B.

FIG. 29 illustrates the removal of dummy gate electrodes 34. Next, as also shown in FIG. 29, dummy gate dielectric 32 (132) (refer to FIG. 28) is removed from device region 100, and gate dielectric 132' is formed, as shown in cross-section 100-channel. Gate dielectric 232 in cross-section 200-channel is kept unremoved. Accordingly, gate dielectric 232 is used as the real gate dielectric of the corresponding FinFET. The details of the process shown in FIG. 29 are shown in the embodiments shown in FIGS. 51-53.

Figure 30:
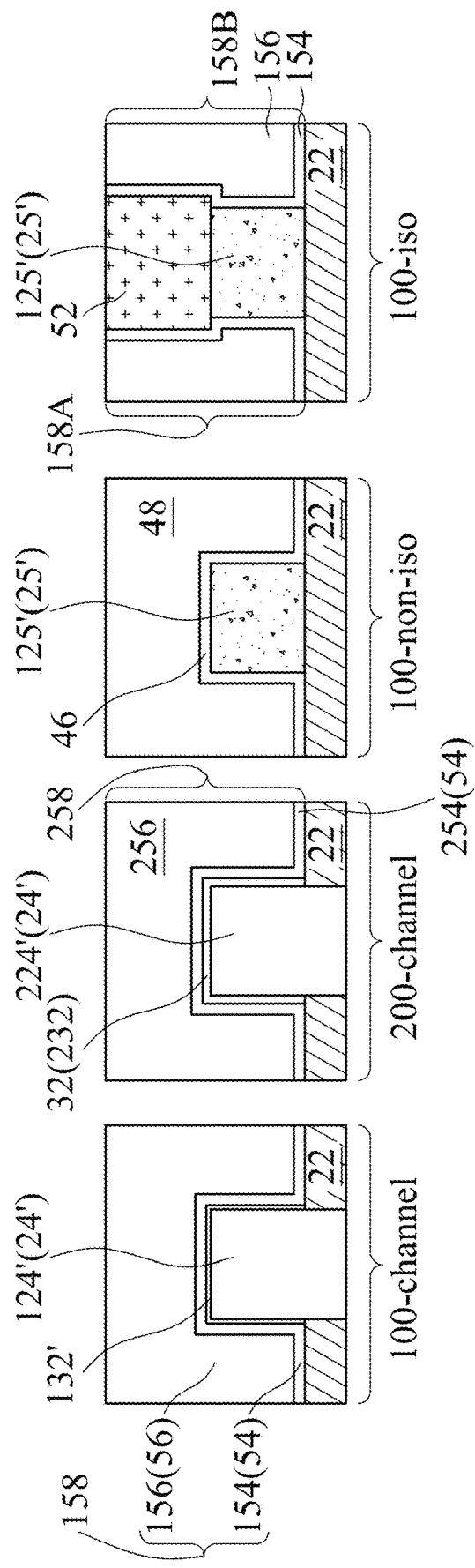

FIG. 30 illustrates the formation of high-k dielectrics 154 and 254 and replacement gate electrodes 156 and 256, which form replacement gate stacks 158 and 258. This process corresponds to the process shown in FIGS. 9A-1, 9A-2, and 9B. As shown in cross-section 100-iso in FIG. 30, dummy fin 25' contacts the overlying gate isolation region 52 to fully separate replacement gate stack 158A from replacement gate stack 158B. If, however, the dummy gate dielectric 32 is not removed from dummy fin 25' before the formation of gate isolation region 52, the dummy gate dielectric 32 will be removed in the process shown in FIG. 29, and a space will be formed between dummy fin 25' and the overlying gate isolation region 52. The material of replacement gate electrode 56 may be filled into the space, causing leakage between gate stacks 158A and 158B. In accordance with some embodiments of the present disclosure, the dummy gate dielectric is selectively removed from dummy fin 25' before the formation of gate isolation region, hence the leakage path is eliminated.

Figure 31:
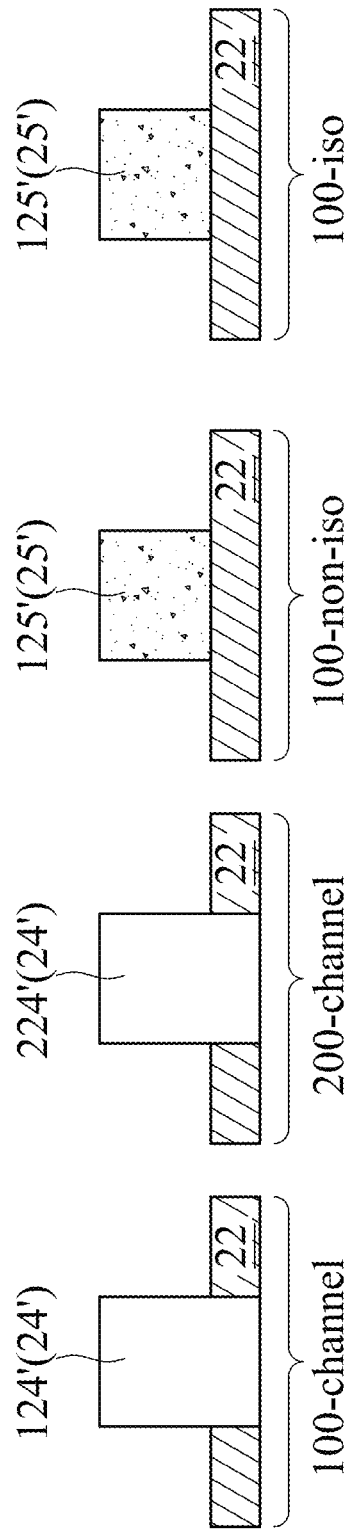
Figure 32:
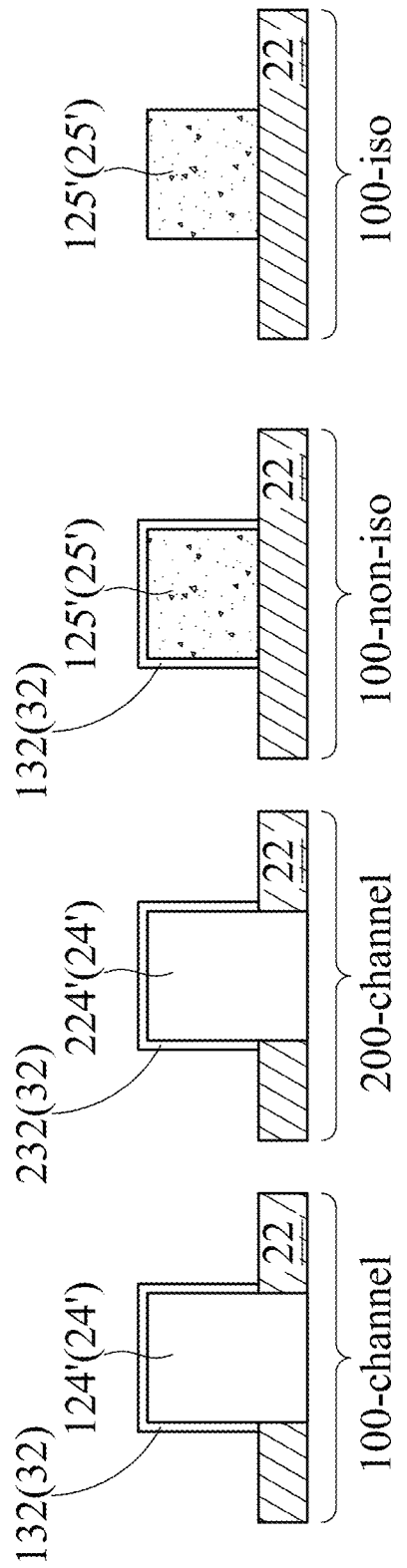
Figure 33:
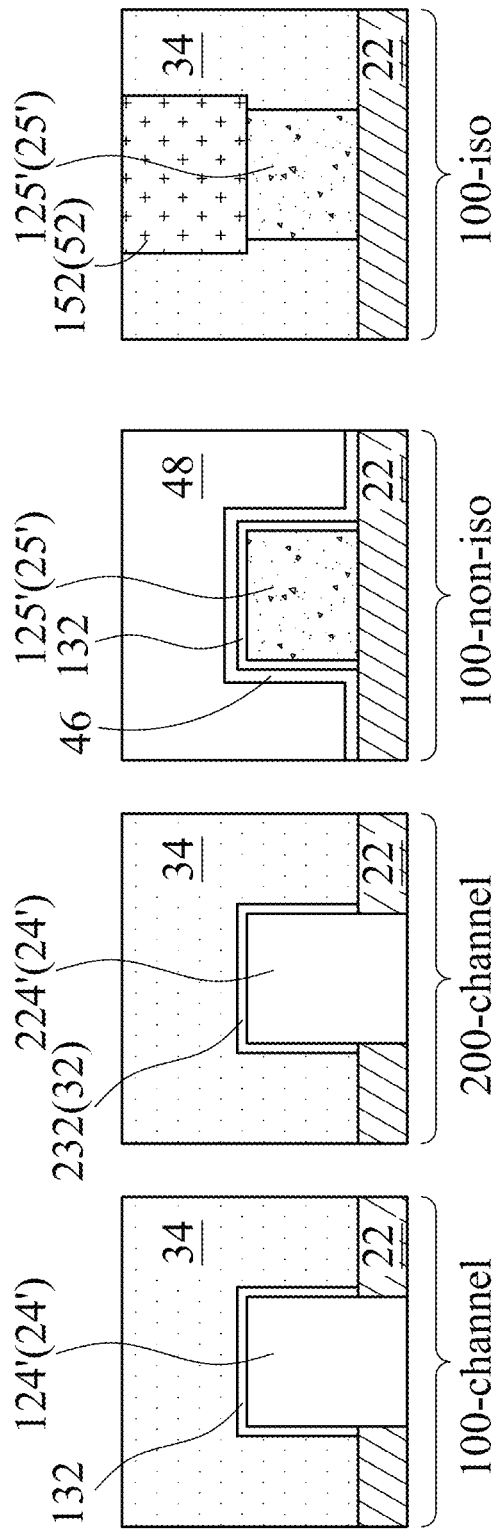
Figure 35:
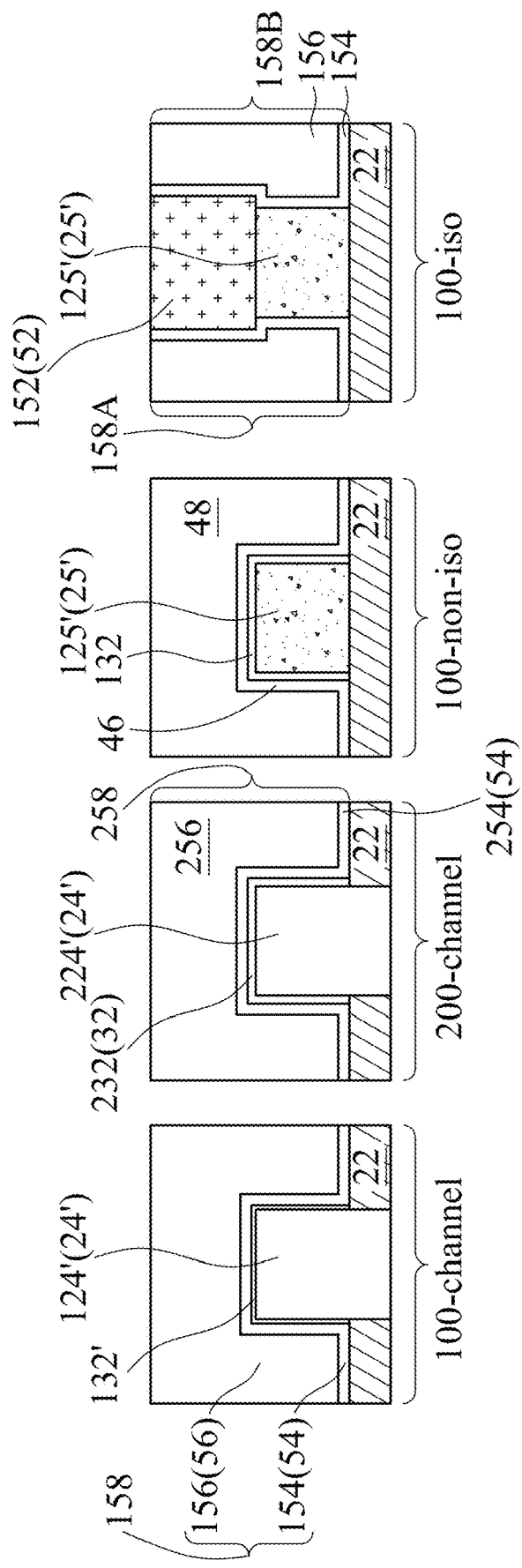

FIGS. 31 through 35 illustrate the cross-sections for the formation process in accordance with alternative embodiments. These embodiments are similar to the embodiments as shown in FIGS. 26 through 30, except that a gate dielectric layer exists in the cross-section 100-non-iso (FIG. 34). Referring to FIG. 31, protruding fins 24' and dummy fins 25' are formed. Next, as shown in FIG. 32, dummy gate dielectrics 32 are formed. Different from the embodiments as shown in FIG. 27, dummy gate dielectric 32 remains on the part of dummy fin 25' in the cross-section 100-non-iso. The details in the formation of the structure in FIG. 32 are shown in the processes illustrated in FIGS. 45-48. FIG. 33 illustrates the formation of dummy gate electrodes 34. Next, CESL 46 and ILD 48 are formed in cross-section 100-non-iso, and dummy gate electrodes 34 are removed, as shown in FIG. 34. Also, dummy gate dielectric 132 is removed from device region 100 (cross-section 100-channel), and is replaced with replacement dielectric layer 132', for example, through deposition, natural oxidization, or the like. The details in the formation of the structure in FIG. 34 are shown in the processes illustrated in FIGS. 54-56. FIG. 35 illustrates the formation of replacement gates 58.

Figure 36:
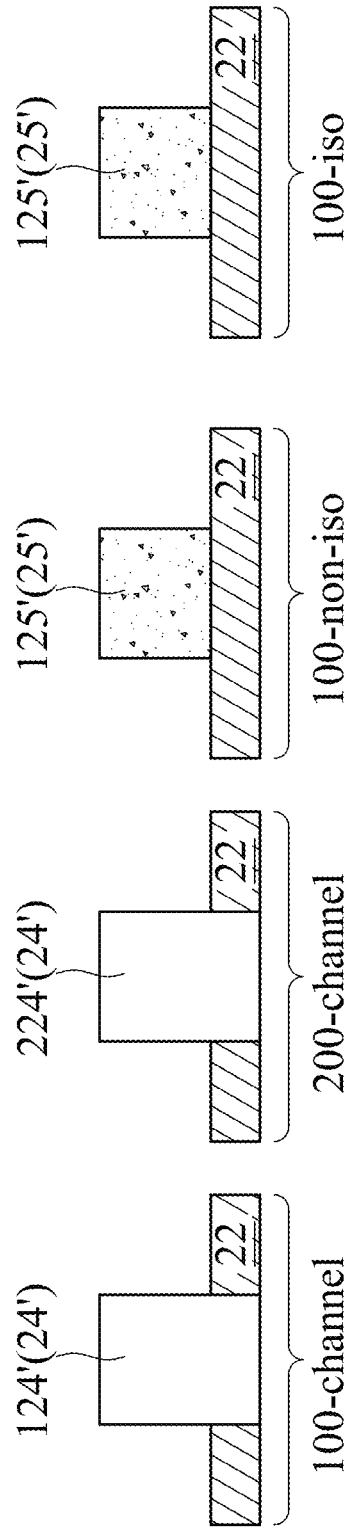
Figure 37:
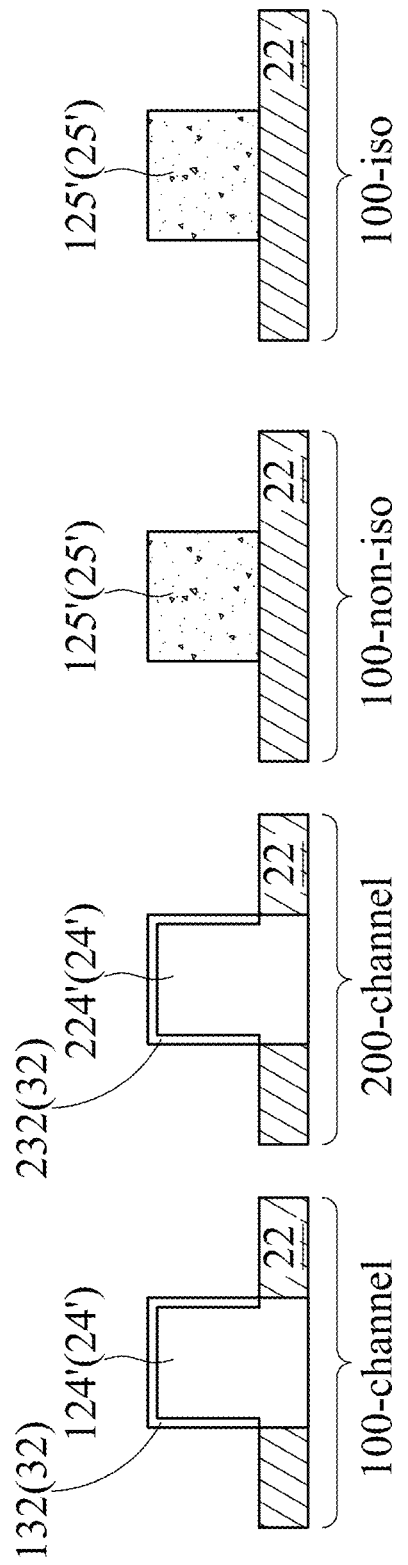
Figure 38:
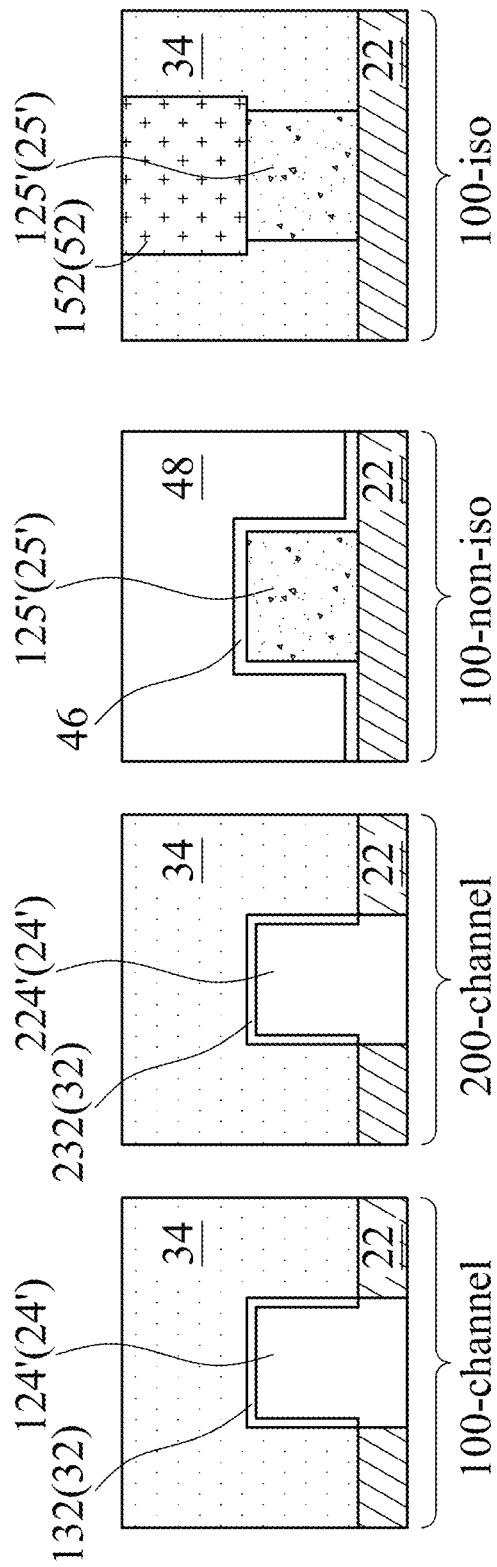
Figure 40:
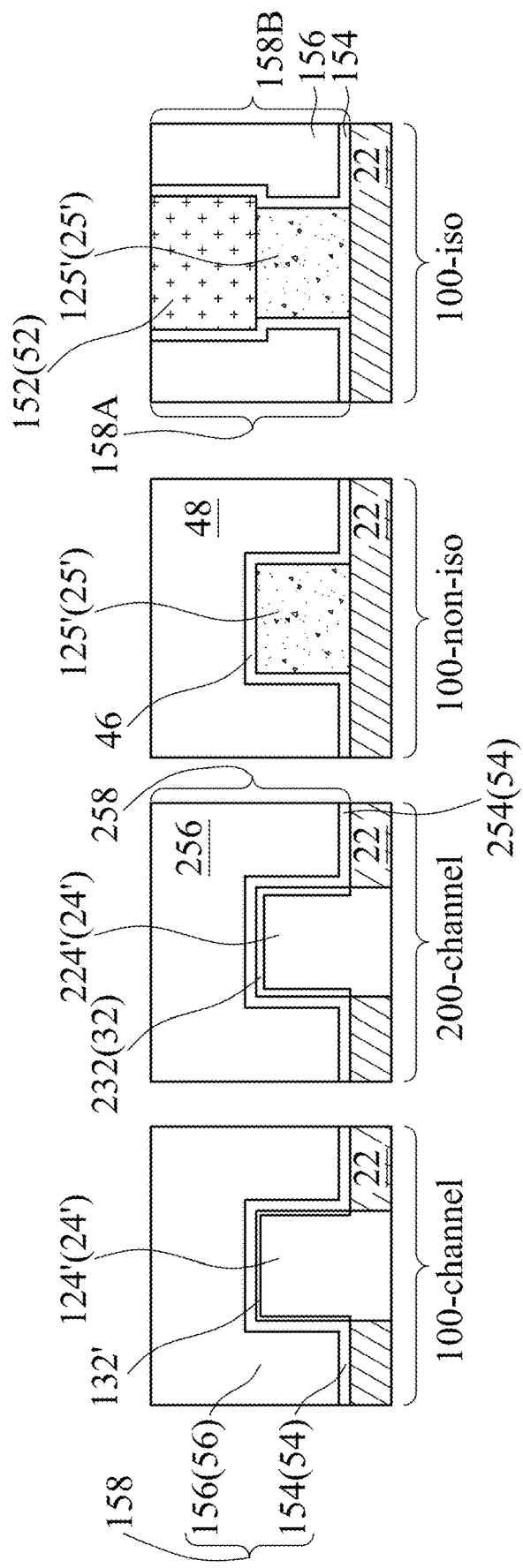

FIGS. 36 through 40 illustrate the cross-sections for the formation process in accordance with alternative embodiments. These embodiments are similar to the embodiments as shown in FIGS. 26 through 30, except that dummy gate dielectrics 32 are formed through oxidizing the surface portions of protruding fins 24'. Referring to FIG. 36, protruding fins 24' and dummy fins 25' are formed. Next, as shown in FIG. 37, dummy gate dielectrics 32 are formed. The details in the formation of the structure in FIG. 37 are shown in the processes illustrated in FIGS. 49-50. FIG. 38 illustrates the formation of CESL 46, ILD 48, and dummy gate electrodes 34. Next, dummy gate electrodes 34 are removed, as shown in FIG. 39. Also, dummy gate dielectric 132 is removed from device region 100 (cross-section 100-channel), and is replaced by replacement dielectric layer 132'. The details in the formation of the structure in FIG. 39 are shown in the processes illustrated in FIGS. 57-59. FIG. 40 illustrates the formation of replacement gates 58.

Figure 41:
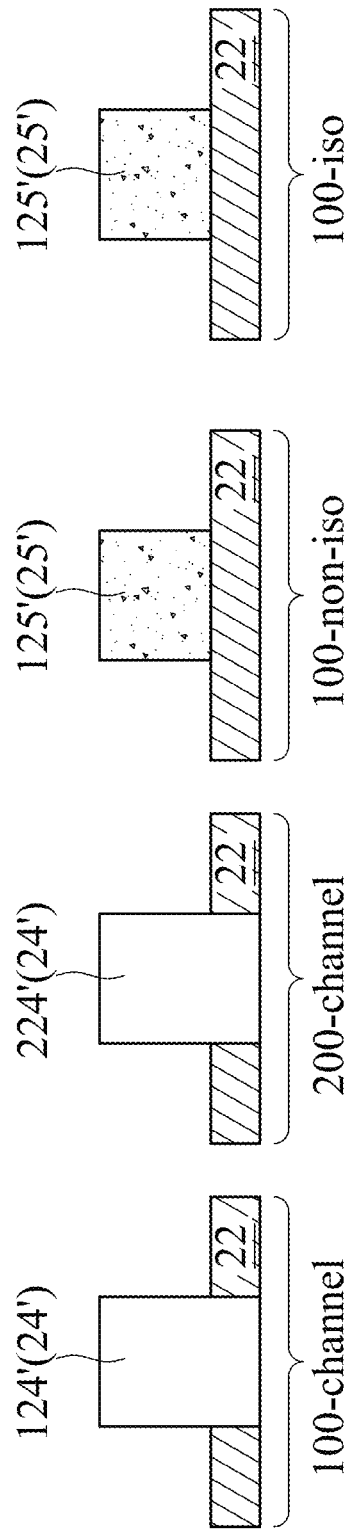
FIGS. 41-44, 45-48, and 49-50 illustrate intermediate stages of various embodiments in the selective formation and removal of dummy gate dielectrics in accordance with some embodiments.
Figure 42:
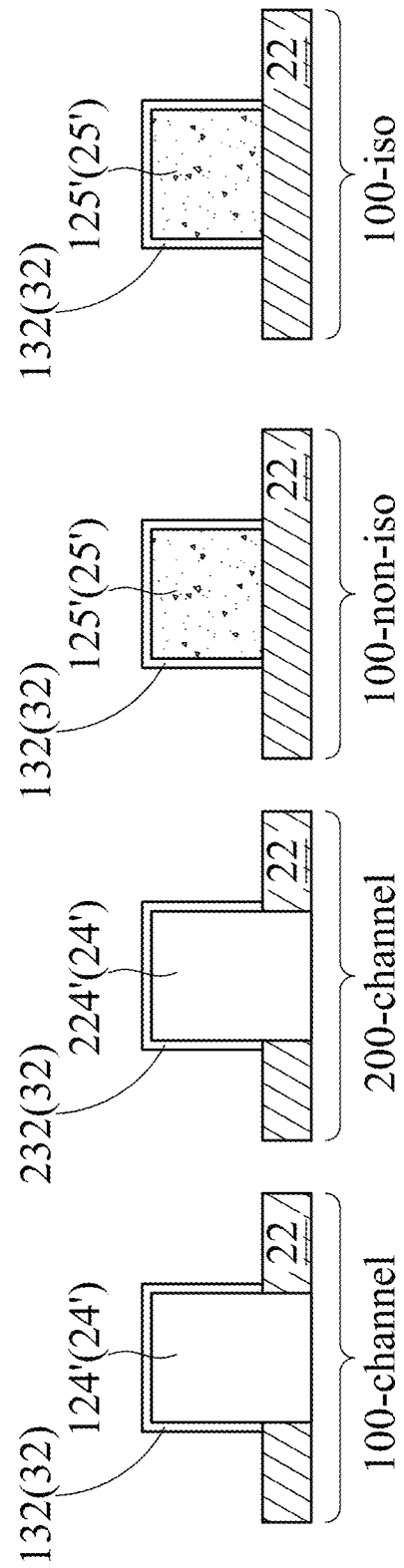
Figure 43:
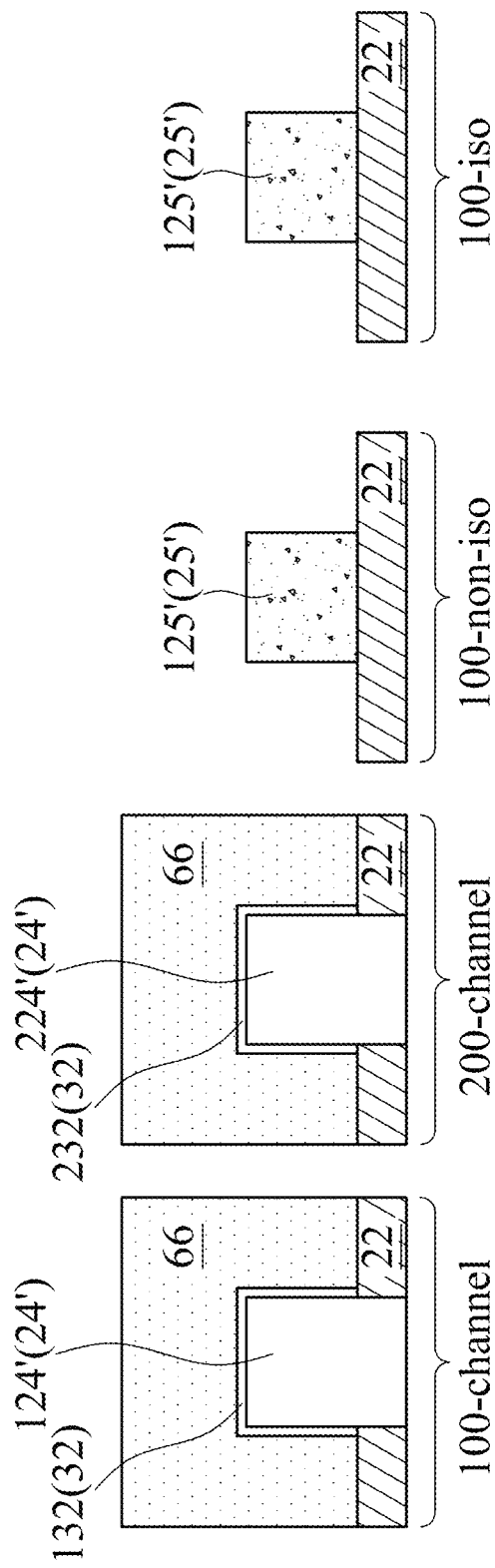
Figure 44:
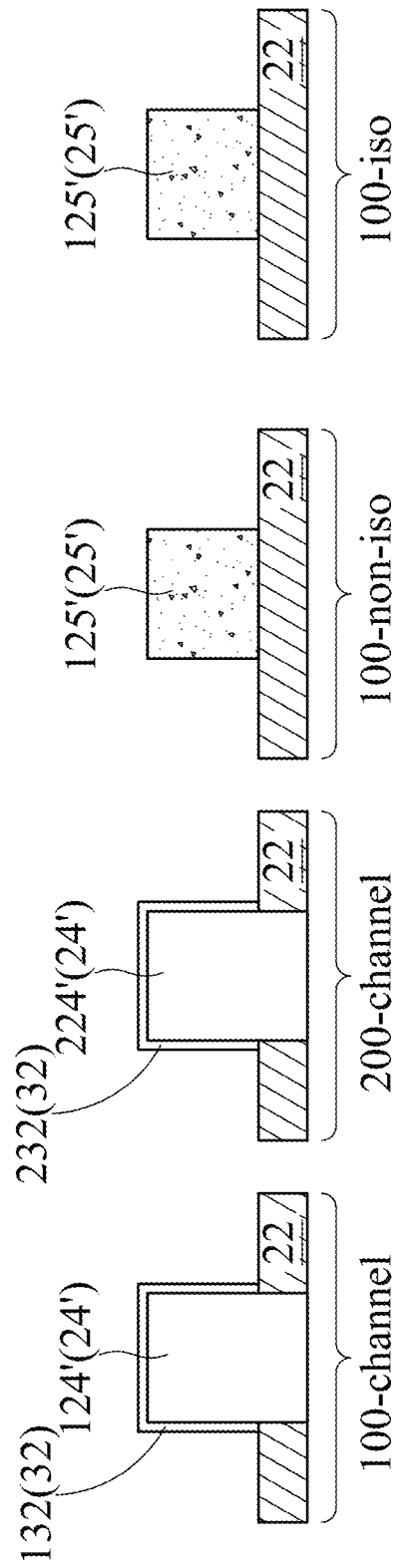

FIGS. 41 through 44 illustrate the processes for forming and then selectively removing gate dielectrics. The process may be adopted to form the structure shown in FIG. 27. FIG. 41 illustrates the starting structure as shown in FIG. 26. Next, as shown in FIG. 42, dummy gate dielectrics 32 are formed in both of device regions 100 and 200, and thus covers all parts of protruding fins 24' and dummy fins 25' in cross-sections 100-channel, 200-channel, 100-non-iso, and 100-iso. In FIG. 43, an etching mask 66, which may be formed of a photo resist, is formed to cover the channel portions of dummy gate dielectrics 32, which channel portions cover the protruding fins 24' in device regions 100 and 200, while leaving the portions of dummy gate dielectrics 32 covering dummy fins 25' exposed through etching mask 66. Next, the exposed portions of dummy gate dielectrics 32 on dummy fins 25' are removed. Etching mask 66 is then removed, and the resulting structure is shown in FIG. 44.

Figure 45:
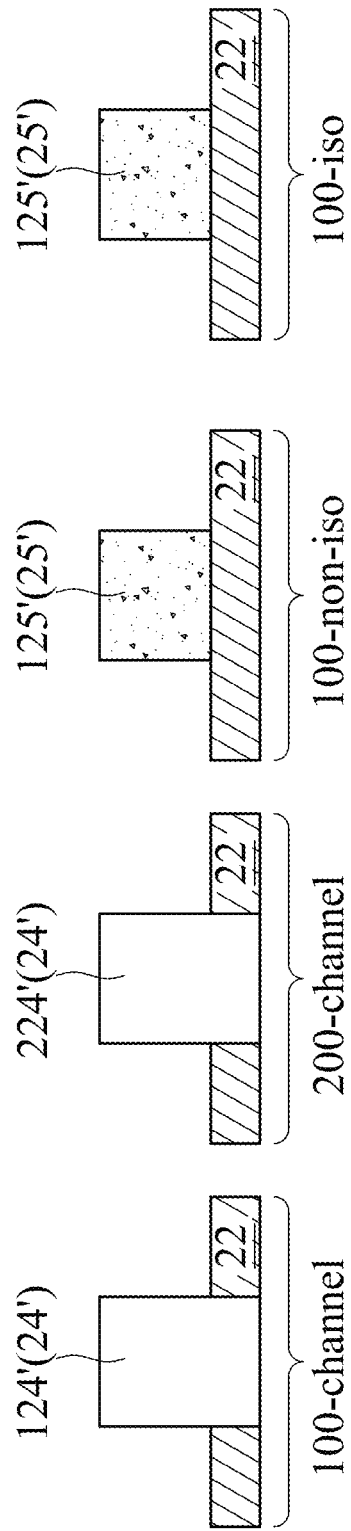
Figure 46:
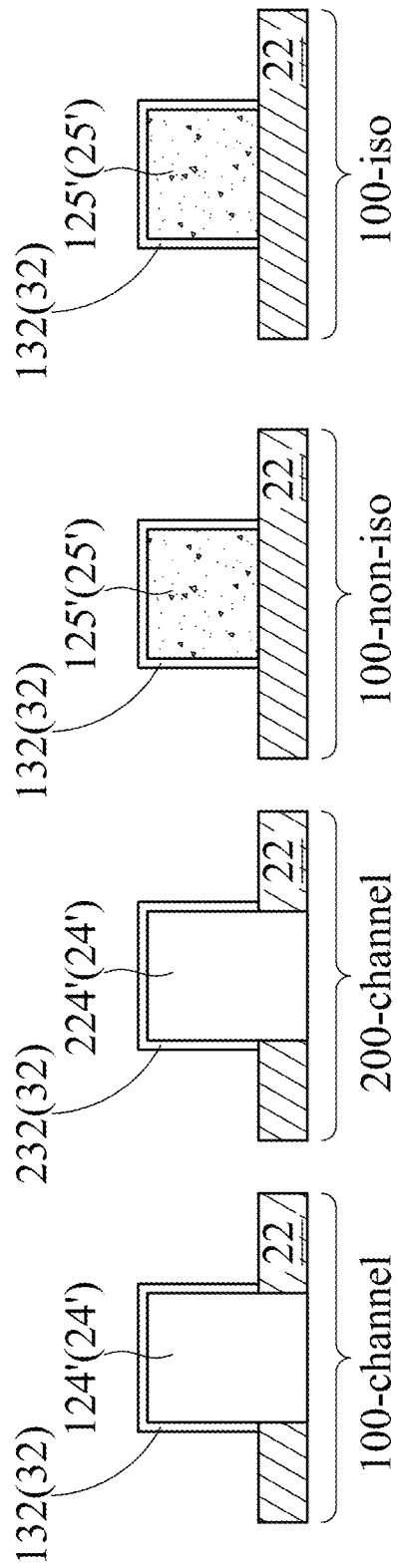
Figure 47:
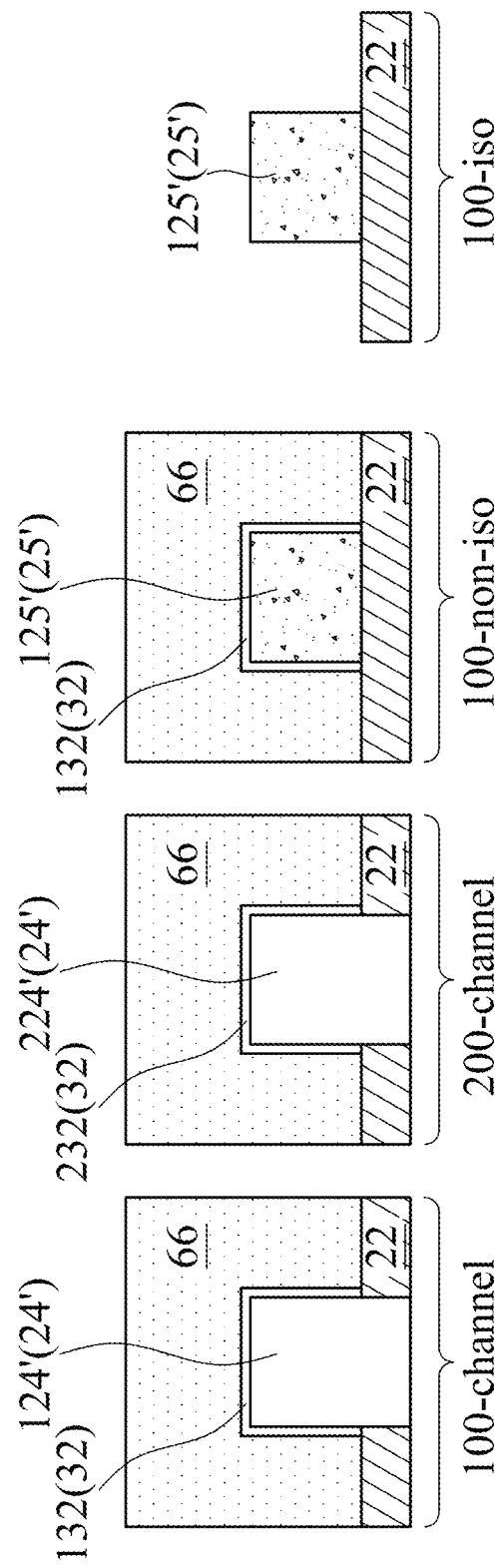
Figure 48:
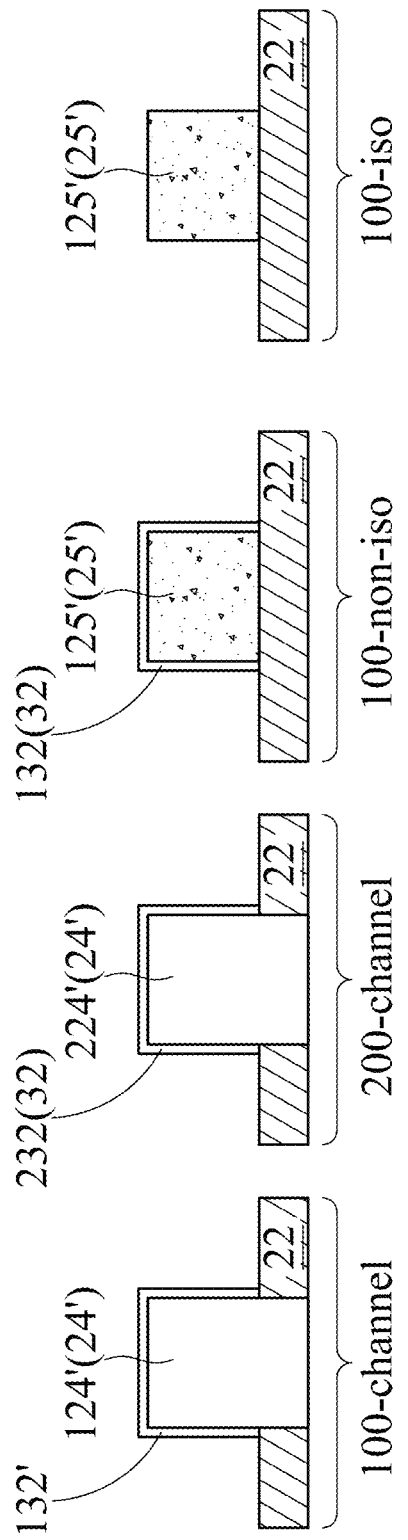

FIGS. 45 through 48 illustrate the processes for forming and then selectively removing gate dielectrics. The process may be adopted to form the structure shown in FIG. 32. FIG. 45 illustrates the starting structure as shown in FIG. 31. Next, as shown in FIG. 46, dummy gate dielectrics 32 are formed in both of device regions 100 and 200, and thus covers all parts of protruding fins 24' and dummy fins 25' in cross-sections (regions) 100-channel, 200-channel, 100-non-iso, and 100-iso. In FIG. 47, an etching mask 66, which may be formed of a photo resist, is formed to cover the channel portions of dummy gate dielectrics 32 covering the protruding fins 24' in device regions 100 and 200. The portion of dummy gate dielectric 32 in cross-section 100-non-iso is also covered, while leaving the portion of dummy gate dielectric 32 covering dummy fins 25' in cross-section 100-iso exposed through etching mask 66. Next, the exposed portions of dummy gate dielectrics 32 are removed. Etching mask 66 is then removed, and the resulting structure is shown in FIG. 48.

The processes as shown in FIGS. 41 through 48 have the cost of extra photo lithography processes. The thickness of the resulting dummy gate dielectrics 32, however, may be adjusted to desirable values.

Figure 49:
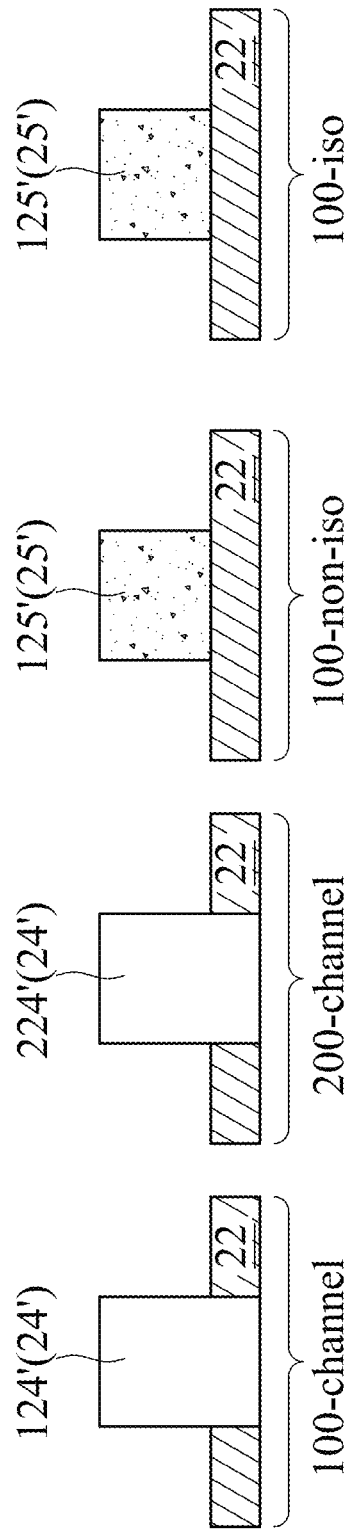
Figure 50:
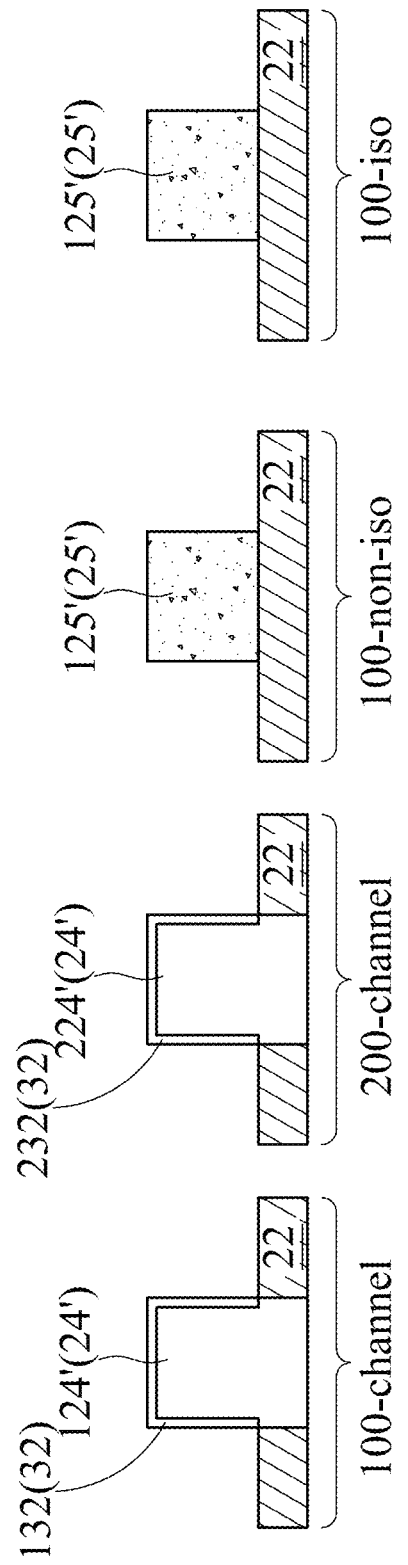

FIGS. 49 and 50 illustrate the processes for selectively forming gate dielectrics in accordance with some embodiments. The process may be adopted to form the structure shown in FIG. 37. FIG. 49 illustrates the starting structure as shown in FIG. 36. Next, as shown in FIG. 50, dummy gate dielectrics 32 are formed on protruding fins 24', wherein the exposed surface layer (for example, formed of Si, SiGe, or the like) of each of protruding fins 24' is converted to a dielectric layer 32, which comprises silicon oxide ($SiO_2$), SiN, SiCN, or the like. The surface layers of dummy fins 25' remain to be dielectric, and hence the surface layer is not shown separately, although the surface layers may also be added with some elements such as oxygen, nitrogen, carbon, and/or the like. The conversion may be achieved through thermal oxidation, thermal nitriding, chemical oxidation, or the like. For example, the thermal oxidation may be performed using $O_2$, $SO_2$, $CO_2$, CO, the like process gases, or combinations thereof. The thermal nitriding may be performed using $N_2$, $NH_3$, the like process gases, or combinations thereof. The resulting dummy gate dielectric 32 may have a thickness in the range between about 3 A and about 50 A. The processes as shown in FIGS. 49 and 50 have the advantageous feature of skipping photo lithography operations. The thickness of the resulting dummy gate dielectric 32, however, is limited.

FIGS. 51-53, 54-56, and 57-59 illustrate some processes for selectively replacing gate dielectric for device region 100 (for example, core region), while leaving the gate dielectric 232 in device region 200 (for example, IO region) as the real gate dielectric.

Figure 51:
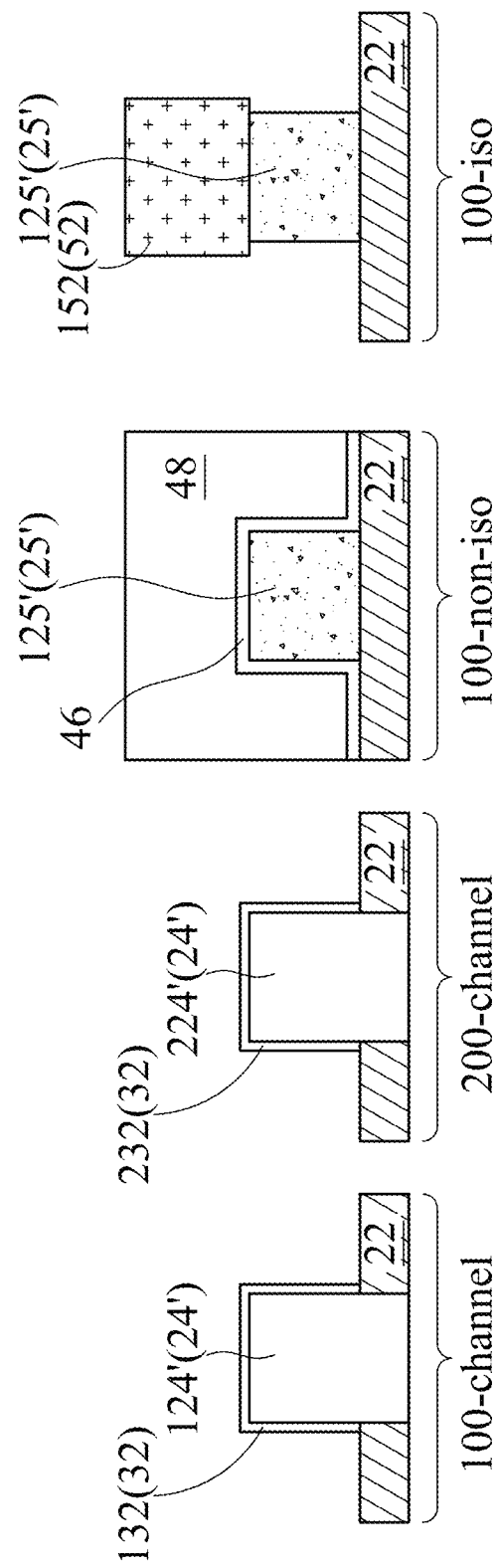
FIGS. 51-53, 54-56, and 57-59 illustrate intermediate stages of various embodiments in the selective formation and removal of dummy gate dielectrics in accordance with some embodiments.
Figure 52:
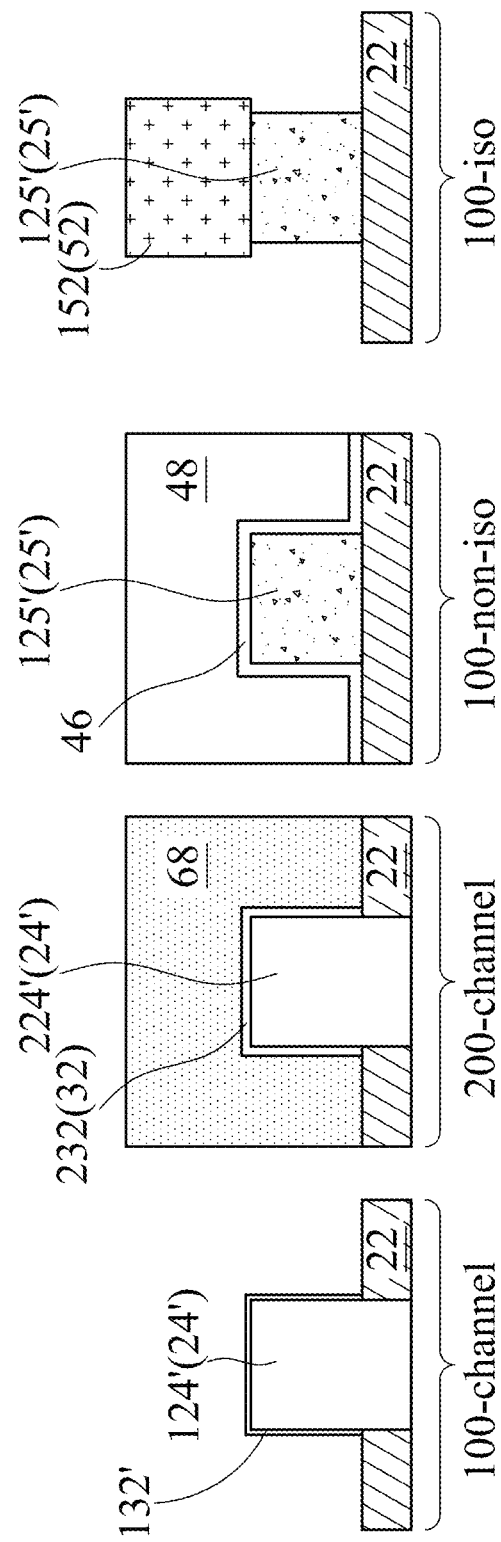
Figure 53:
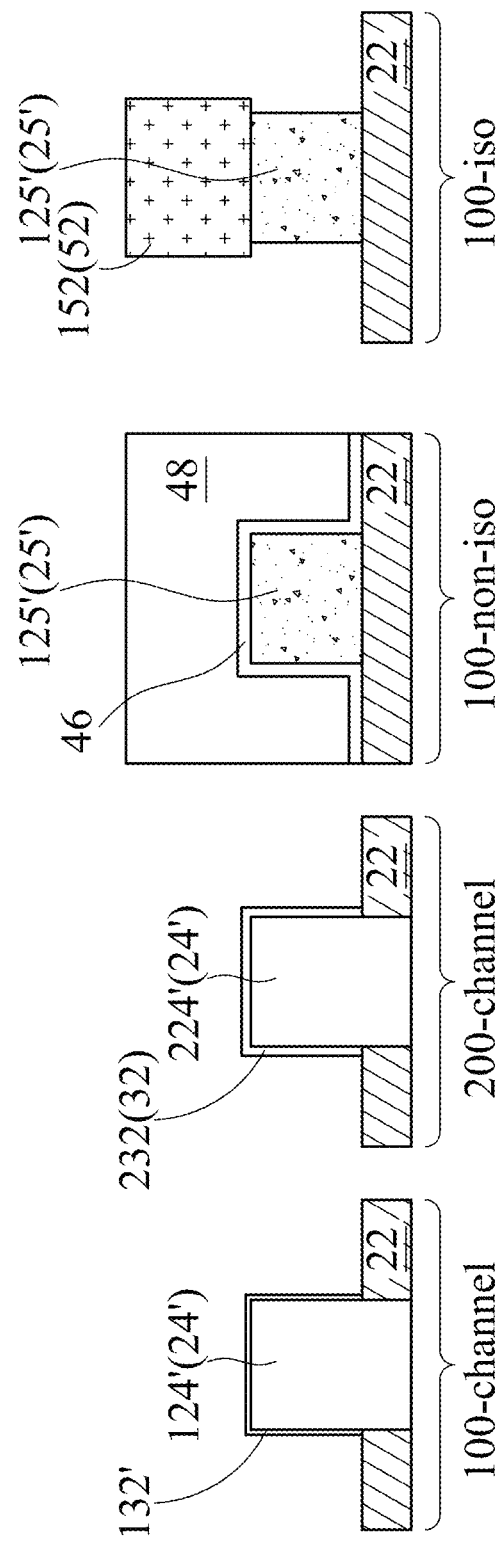

FIGS. 51-53 illustrate an embodiment in which no gate dielectric is formed on dummy fins 25'. The process may be adopted to form the structure shown in FIG. 29. FIG. 51 may correspond to the structure shown in FIG. 28, except the gate electrodes 34 shown in FIG. 28 have been removed. Next, as shown in FIG. 52, etching mask 68, which may be a photo resist, is formed and patterned to cover device region 200 (cross-section 200-channel), leaving device region 100 (including the portions appearing in cross-sections 100-channel, 100-non-iso, and 100-iso) exposed. Next, the dummy gate dielectric 132 is removed, and is replaced by gate dielectric 132', as also shown in FIG. 52. Gate dielectric 132' may be a native oxide, or may be formed through deposition or an oxidation process. The thickness may be in the range between about 3 Å and about 100 Å. Etching mask 68 is then removed, and the resulting structure is shown in FIG. 53.

Figure 54:
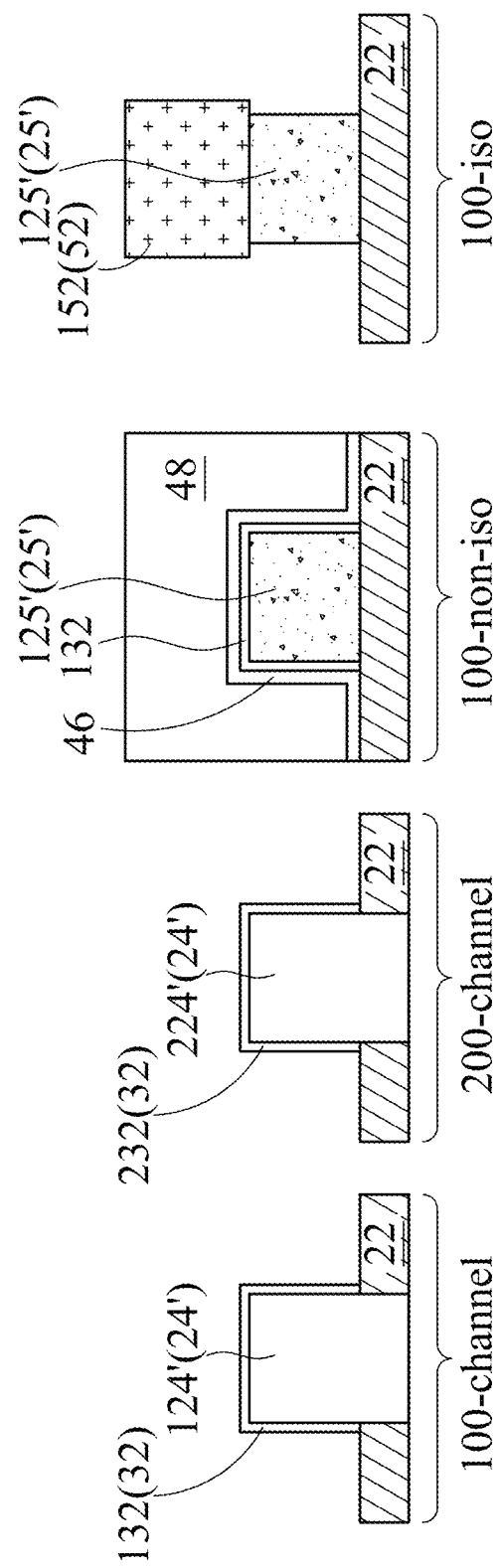
Figure 55:
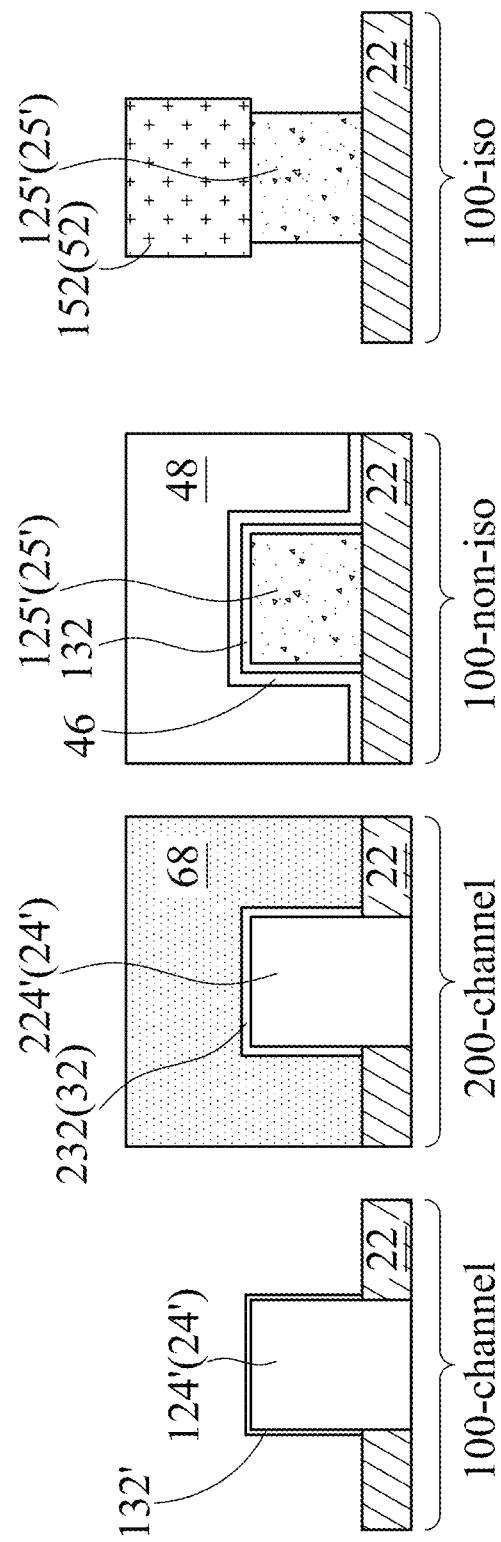
Figure 56:
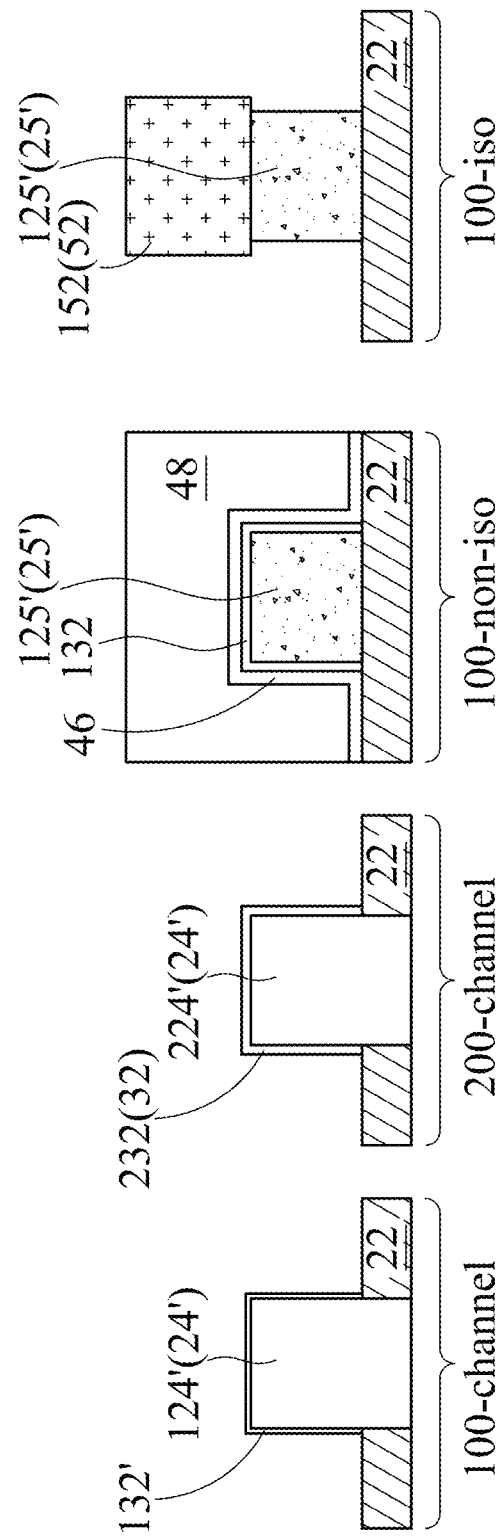

FIGS. 54-56 illustrate an embodiment in which a thin gate dielectric is formed on the part of dummy fin 25' in the cross-section 100-non-iso, and not on the part of dummy fin 25' in the cross-section 100-iso. The process may be adopted to form the structure shown in FIG. 34. FIG. 54 may correspond to the structure shown in FIG. 33, except the gate electrodes 34 shown in FIG. 33 have been removed. Next, as shown in FIG. 55, etching mask 68 is formed and patterned to cover device region 200 (cross-section 200-channel), leaving device region 100 (including the portions in cross-sections 100-channel, 100-non-iso, and 100-iso) exposed. Next, the dummy gate dielectric 132 as shown in FIG. 54 is removed, and is replaced by gate dielectric 132' as shown in FIG. 55. The formation process may include a deposition process. Gate dielectric 132' may be formed of or comprises silicon oxide, silicon nitride, or the like. Etching mask 68 is removed, and the resulting structure is shown in FIG. 56.

Figure 57:
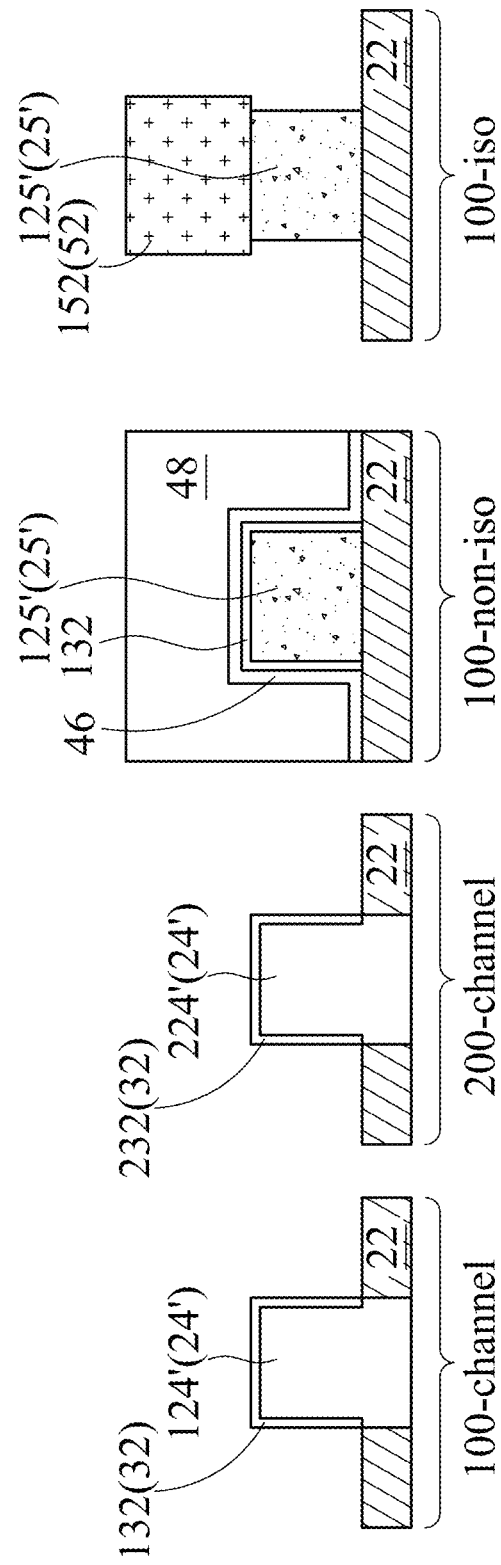
Figure 58:
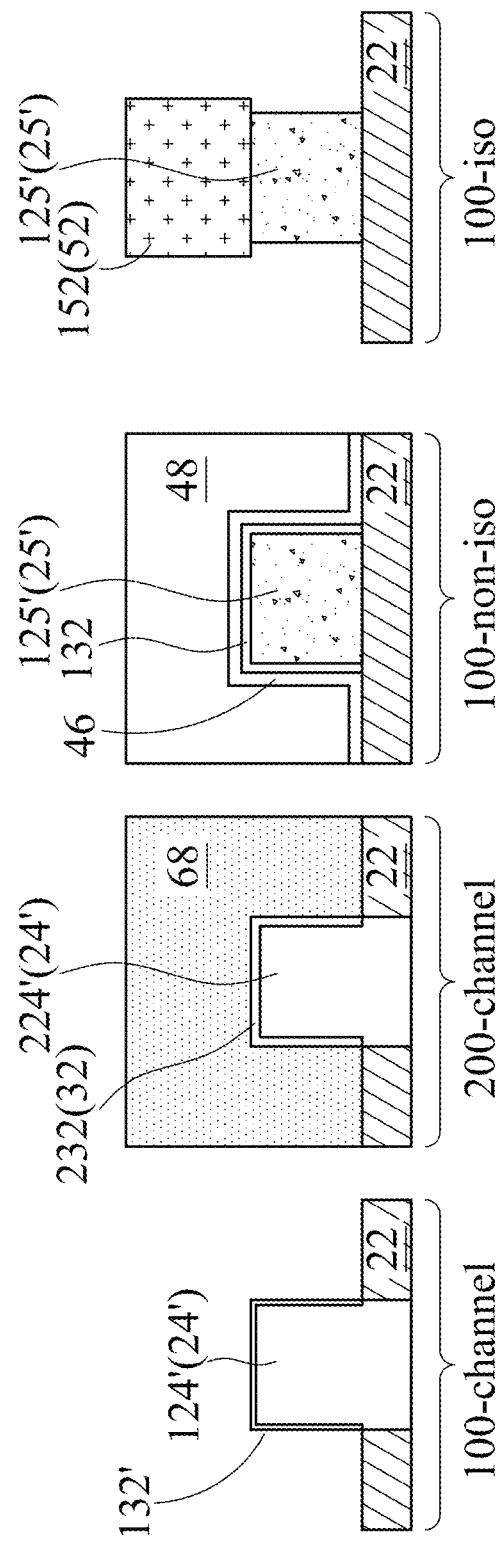
Figure 59:
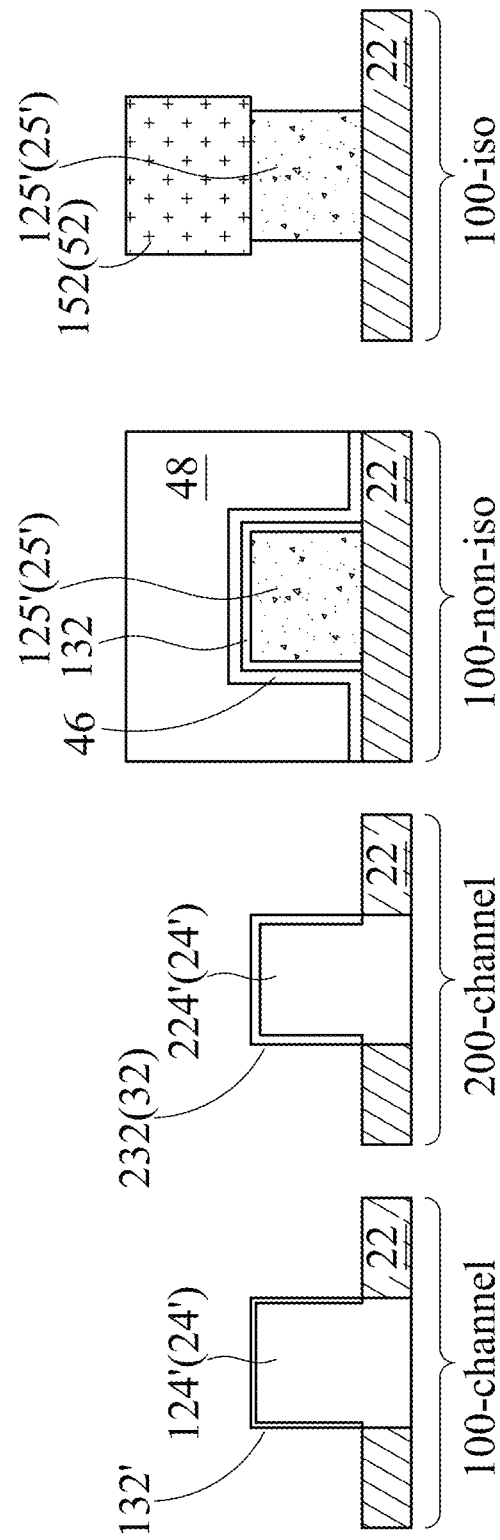

FIGS. 57-59 illustrate an embodiment similar to the embodiment shown in FIGS. 51-53, except dummy gate dielectrics 32 are formed by oxidation, nitriding, or the like. The process may be adopted to form the structure shown in FIG. 39. FIG. 57 may correspond to the structure shown in FIG. 38, except the gate electrodes 34 as shown in FIG. 38 have been removed. As shown in FIG. 58, etching mask 68 is formed. Next, the dummy gate dielectric 132 as shown in FIG. 57 is removed, and is replaced by gate dielectric 132' as shown in FIG. 58. Etching mask 68 is then removed, and the resulting structure is shown in FIG. 59.

Figure 60:
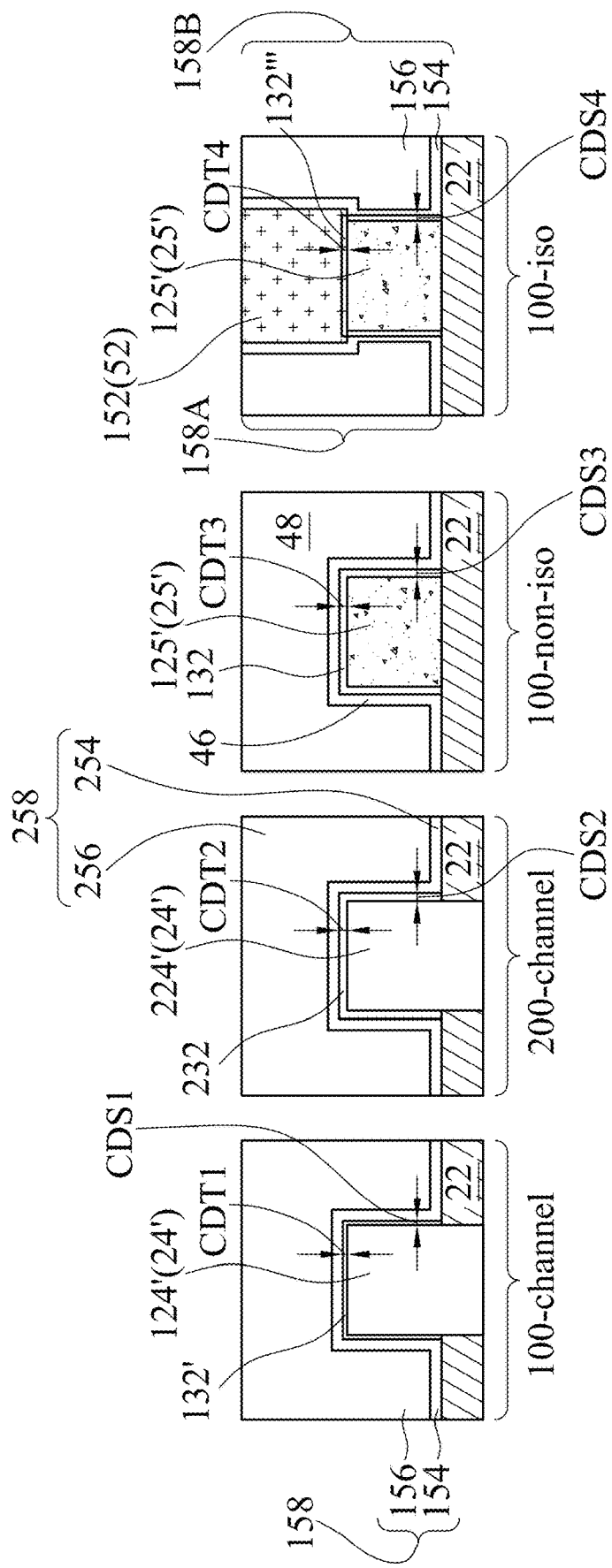
FIGS. 60 and 61 illustrate the cross-sectional views of some parts of structures in accordance with some embodiments.

FIG. 60 illustrates the cross-sections of gate structures, which cross-sections are obtained from the structure shown in FIGS. 9A-1, 9A-2, and 9B, and are also shown in FIGS. 30 and 40. The sidewall thicknesses of the dielectric layer 132', 232, and 132''' (if exists) are shown as CDS1, CDS2, CDS3, and CDS4, respectively. The top thicknesses of the dielectric layer 132', 232, 132, and 132''' (if exists) are shown as CDT1, CDT2, CDT3, and CDT4, respectively, wherein dielectric layer 132''' is the oxidized part of dummy fin 125'.

In accordance with some embodiments, there exist the relationships CDS1>CDS3, and CDS1>CDS4. There may also exist the relationships CDT1>CDT3, CTD3=CDT4, CDS1<CDS2, and CDT1<CDT2. The ratios CDS2/CDS1 and CDT2/CDT1 may be greater than about 2, and may be between about 5 and about 10. Thicknesses CDT3, CDT4, CDS3, and CDS4 may be equal to zero (when the respective dielectric layers 132 and/or 132''' do not exist), or equal to the thickness of native oxide (about 3 Å, and may be between 2 Å and about 4 Å).

Figure 61:
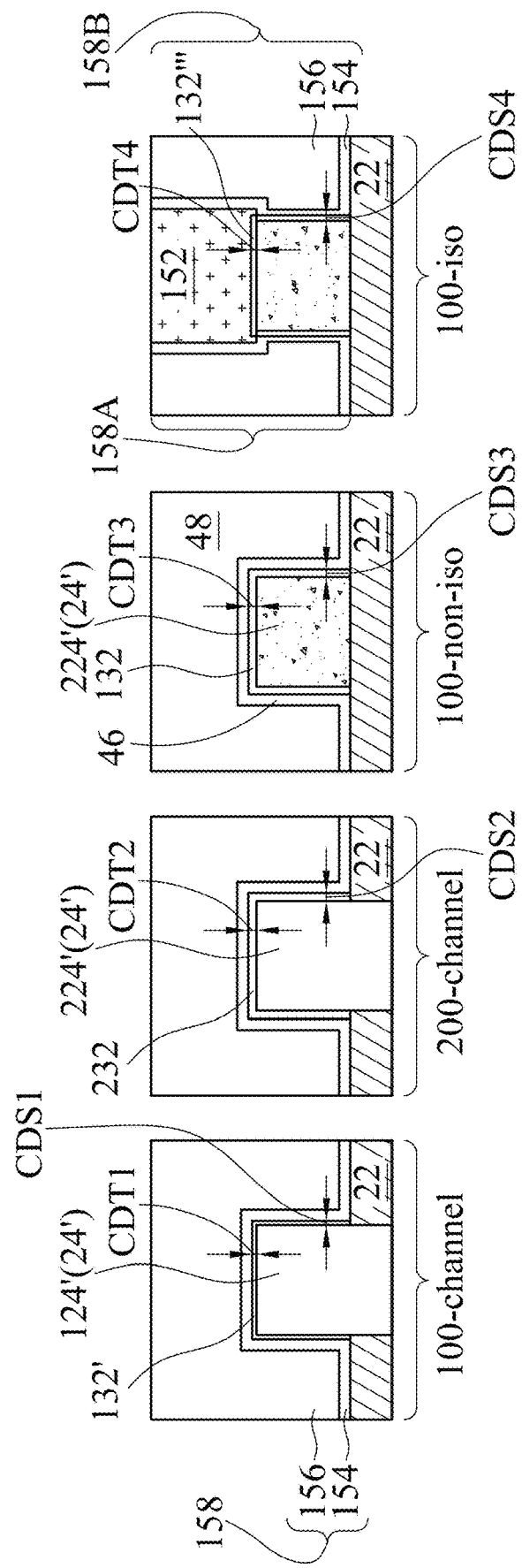
Figure 62:
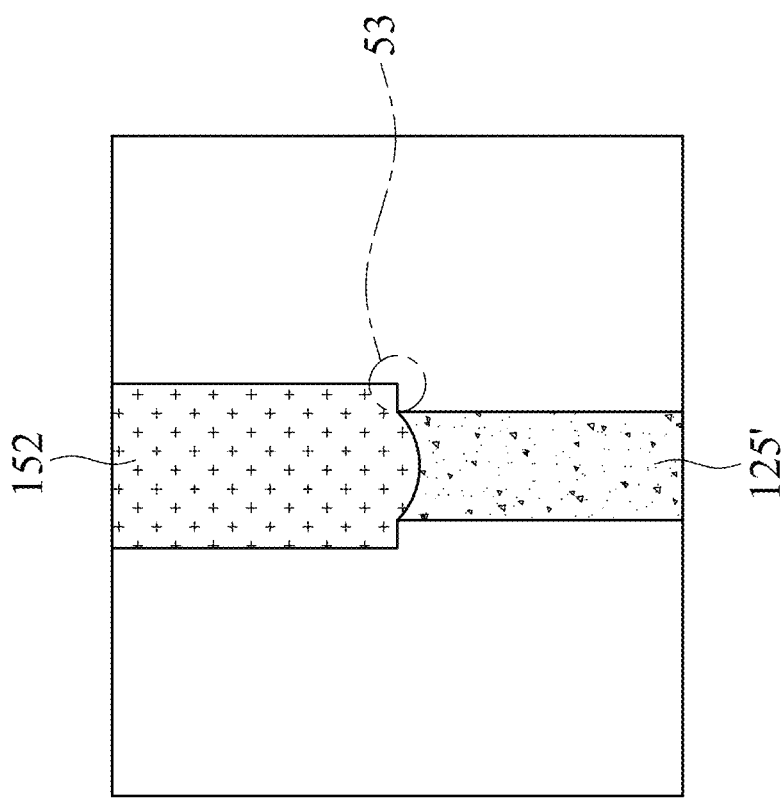
FIG. 62 illustrates a cross-sectional view of a dummy fin and a gate isolation region in accordance with some embodiments.

FIG. 61 illustrates the cross-sections of gate structures, which cross-sections are obtained from the structure shown in FIGS. 9A-1, 9A-2, and 9B, and are also shown in FIG. 35. In accordance with some embodiments, thickness CDS1 is close to or equal to thickness CDS3, and there may exist the relationship CDS3>CDS4. Thickness CDT1 is close to or equal to thickness CDT3, and there may exist the relationships CDT1<CDT2, and CDT3>CDT4. There exist the relationships CDS1<CDS2 and CDT1<CDT2. The ratios CDS2/CDS1 and CDT2/CDT1 may be greater than about 2, and may be between about 5 and about 10. In FIGS. 61 and 62, each of CDS1, CDT1, CDS3, CDT3, CDS4, and CDT4 may be in the range between about 3 Å (when being a native oxide) and about 100 Å. CDS2 and CDT2 may be in the range between about 10 Å and about 100 Å.

FIG. 62 illustrates a cross-sectional view of gate isolation region 152 and dummy fin 125' in accordance with some embodiments. Through the formation process of the present disclosure, due to the selective removal of gate dielectric 32, which selective removal process is performed before the formation of gate isolation region 152, the middle top surface portion of dummy fin 125' may be recessed lower than the opposing portions. Gate isolation region 152 accordingly extends into the recess in dummy fin 125'. Also, the bottom corners 53 of gate isolation region 152 have right angles (90 degrees).

The embodiments of the present disclosure have some advantageous features. By removing the dummy gate dielectrics from dummy fins before the formation of gate isolation regions, there is no spaces generated between the dummy fins and the overlying gate isolation regions. If the spaces are formed, which are caused by the removal of the dummy gate dielectrics between the gate isolation regions and the underlying dummy fins, the spaces may be filled with the materials of replacement gate electrodes. This will cause the leakage between the replacement gate electrodes on the opposing sides of the corresponding gate isolation region and the dummy fins. Accordingly, through the embodiments of the present disclosure, the risk of leakage is eliminated.

In accordance with some embodiments of the present disclosure, a method comprises forming an active channel region; forming a dummy channel region; forming a first gate dielectric layer over the active channel region; forming a second gate dielectric layer over the dummy channel region; removing the second gate dielectric layer from the dummy channel region; forming a gate isolation region over and contacting the dummy channel region; and forming a first gate stack and a second gate stack, wherein the first gate stack is on the active channel region, and wherein the gate isolation region separates the first gate stack from the second gate stack. In an embodiment, the method further comprises, after the second gate dielectric layer is removed, forming a dummy gate electrode over the dummy channel region; and patterning the dummy gate electrode to form an opening, wherein the gate isolation region is formed in the opening. In an embodiment, the method further comprises, after the gate isolation region is formed, removing the dummy gate electrode. In an embodiment, in the first gate stack and the second gate stack are in contact with, and are separated from each other by, both of the dummy channel region and the gate isolation region. In an embodiment, in the first gate stack and the second gate stack comprise a first gate dielectric and a second gate dielectric, respectively, wherein each of the first gate dielectric and the second gate dielectric has a sidewall portion in physical contact with both of the dummy channel region and the gate isolation region. In an embodiment, the first gate dielectric layer and the second gate dielectric layer are deposited in a common deposition process. In an embodiment, the method further comprises removing the first gate dielectric layer from the active channel region; and forming a replacement gate dielectric layer on the active channel region. In an embodiment, the dummy channel region comprises: a first portion, wherein the second gate dielectric layer is removed from the first portion; and a second portion, wherein the second gate dielectric layer remains on the second portion at a time after the second gate dielectric layer is removed from the first portion. In an embodiment, the first portion is between the first gate stack and the second gate stack, and the method further comprises forming a first source/drain region and a second source/drain region on opposing sides of the second portion.

In accordance with some embodiments of the present disclosure, a device comprises a dummy fin comprising a first portion and a second portion, wherein the dummy fin comprises a dielectric material; a gate isolation region over and contacting the dummy fin; a first gate stack and a second gate stack on opposing sides of, and contacting, the first portion of the dummy fin; a contact etch stop layer on opposing sidewalls and a top surface of the second portion of the dummy fin; and an inter-layer dielectric over the contact etch stop layer. In an embodiment, the first gate stack and the second gate stack are portions of a first FinFET and a second FinFET, respectively. In an embodiment, the first FinFET comprises a first gate dielectric comprising a first silicon oxide layer, and the device further comprises a third FinFET comprising a protruding semiconductor fin; and a second gate dielectric over and contacting the protruding semiconductor fin, wherein the second gate dielectric comprises a second silicon oxide layer thicker than the first silicon oxide layer. In an embodiment, the dummy fin and the gate isolation region are formed of different materials. In an embodiment, the dummy fin comprises a first top surface, and second top surfaces on opposing sides of the first top surface, wherein the first top surface is recessed lower than the second top surfaces. In an embodiment, the gate isolation region extends laterally beyond edges of the dummy fin, and the gate isolation region comprises bottom corners with right angles. In an embodiment, the device further comprises a dummy gate dielectric between and contacting the contact etch stop layer and the second portion of the dummy fin.

In accordance with some embodiments of the present disclosure, a device comprises a semiconductor substrate; isolation regions extending into the semiconductor substrate; a first protruding semiconductor fin and a second protruding semiconductor fin parallel to each other and protruding higher than the isolation regions; a dummy fin between the first protruding semiconductor fin and the second protruding semiconductor fin; a first gate stack and a second gate stack extending on top surfaces and sidewalls of the first protruding semiconductor fin and the second protruding semiconductor fin, respectively; and a gate isolation region between the first gate stack and the second gate stack, wherein the gate isolation region is over and contacting the dummy fin. In an embodiment, the device further comprises a first gate spacer and a second gate spacer, wherein each of the gate isolation region, the first gate stack, and the second gate stack is between, and is in contact with, both of the first gate spacer and the second gate spacer. In an embodiment, the device further comprises a contact etch stop layer contacting opposing sidewalls of the dummy fin; and an inter-layer dielectric over the contact etch stop layer. In an embodiment, the gate isolation region is in contact with the first gate stack and the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a dummy fin comprising a first portion and a second portion, wherein the dummy fin comprises a dielectric material;
   a gate isolation region over and contacting the dummy fin;
   a first gate stack and a second gate stack on opposing sides of, and contacting, the first portion of the dummy fin;
   a contact etch stop layer on opposing sidewalls and a top surface of the second portion of the dummy fin;
   a dummy gate dielectric between and contacting the contact etch stop layer and the second portion of the dummy fin; and
   an inter-layer dielectric over the contact etch stop layer.

2. The device of claim 1, wherein the first gate stack and the second gate stack are portions of a first Fin Field-Effect Transistor (FinFET) and a second FinFET, respectively.

3. The device of claim 2, wherein the first FinFET comprises a first gate dielectric comprising a first silicon oxide layer, and the device further comprises a third FinFET comprising:
   a protruding semiconductor fin; and
   a second gate dielectric over and contacting the protruding semiconductor fin, wherein the second gate dielectric comprises a second silicon oxide layer thicker than the first silicon oxide layer.

4. The device of claim 1, wherein the dummy fin and the gate isolation region are formed of different materials.

5. The device of claim 1, wherein the dummy fin comprises a first top surface, and second top surfaces on opposing sides of the first top surface, wherein the first top surface is recessed lower than the second top surfaces.

6. The device of claim 1, wherein the gate isolation region extends laterally beyond edges of the dummy fin, and the gate isolation region comprises bottom corners with right angles.

7. The device of claim 1 further comprising a dielectric isolation region under the second portion of the dummy fin and extending laterally beyond opposing sidewalls of the second portion of the dummy fin, wherein the contact etch stop layer contacts a top surface of the dielectric isolation region to form a horizontal interface.

8. A device comprising:
   a semiconductor substrate;
   isolation regions extending into the semiconductor substrate;
   a first protruding semiconductor fin and a second protruding semiconductor fin parallel to each other and protruding higher than the isolation regions;
   a dummy fin between the first protruding semiconductor fin and the second protruding semiconductor fin, wherein the dummy fin comprises a first portion and a second portion;
   a dummy gate dielectric contacting a sidewall and a top surface of the second portion of the dummy fin, wherein the first portion of the dummy fin is free from the dummy gate dielectric thereon;
   a contact etch stop layer on the dummy gate dielectric;
   a first gate stack and a second gate stack extending on top surfaces and sidewalls of the first protruding semiconductor fin and the second protruding semiconductor fin, respectively; and
   a gate isolation region between the first gate stack and the second gate stack, wherein the gate isolation region is over and contacting the first portion of the dummy fin.

9. The device of claim 8 further comprising a first gate spacer and a second gate spacer, wherein each of the gate isolation region, the first gate stack, and the second gate stack is between, and is in contact with, both of the first gate spacer and the second gate spacer.

10. The device of claim 8, wherein the gate isolation region is in contact with the first gate stack and the second gate stack.

11. The device of claim 8, wherein the gate isolation region extends laterally beyond edges of the dummy fin.

12. The device of claim 8, wherein the first gate stack comprises:
   a gate dielectric in physical contact with sidewalls of both of the dummy fin and the gate isolation region; and
   a gate electrode on the gate dielectric.

13. The device of claim 8 further comprising a source/drain region on a side of the first gate stack, wherein the contact etch stop layer extends on the source/drain region.

14. The device of claim 8, wherein each of the dummy fin and the gate isolation region is formed of a homogeneous material.

15. The device of claim 8 further comprising a dielectric isolation region under the second portion of the dummy fin and extending laterally beyond opposing sidewalls of the second portion of the dummy fin, wherein the contact etch stop layer contacts a top surface of the dielectric isolation region to form a horizontal interface.

16. The device of claim 15, wherein the dielectric isolation region forms an additional horizontal interface with the second portion of the dummy fin.

17. A device comprising:
   a semiconductor substrate;
   isolation regions extending into the semiconductor substrate;
   a protruding semiconductor fin protruding higher than the isolation regions;
   a dummy fin protruding higher than the isolation regions, wherein the dummy fin is parallel to the protruding semiconductor fin, and wherein the dummy fin comprises a first portion and a second portion;
   a gate isolation region over and contacting the first portion of the dummy fin;
   a gate stack contacting sidewalls of both of the dummy fin and the gate isolation region;
   a dummy gate dielectric on sidewalls and a top surface of the second portion of the dummy fin;

a contact etch stop layer over the dummy gate dielectric; and an inter-layer dielectric over the contact etch stop layer.

18. The device of claim 17, wherein one of the isolation regions is underlying and contacting the second portion of the dummy fin.

19. The device of claim 18, wherein the contact etch stop layer comprises a bottom surface physically contacting a top surface of the one of the isolation regions.

20. The device of claim 18, wherein each of the dummy fin and the gate isolation region is formed of a homogenous dielectric material.

* * * * *